(12) United States Patent
Hasegawa et al.

(10) Patent No.: US 6,500,570 B2
(45) Date of Patent: Dec. 31, 2002

(54) SPIN-VALVE MAGNETORESISTIVE ELEMENT AND METHOD FOR MAKING THE SAME

(75) Inventors: Naoya Hasegawa, Niigata-ken (JP); Fumihito Koike, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 174 days.

(21) Appl. No.: 09/730,955

(22) Filed: Dec. 5, 2000

(65) Prior Publication Data

US 2001/0018135 A1 Aug. 30, 2001

(30) Foreign Application Priority Data

Dec. 6, 1999 (JP) .......................................... 11-346930

(51) Int. Cl.$^7$ ................................................ G11B 5/39
(52) U.S. Cl. .................. 428/692; 360/324.11; 148/108; 148/121; 29/603.08
(58) Field of Search ..................... 428/692; 360/324.11, 360/324.12; 148/108, 121; 29/603.08

(56) References Cited

U.S. PATENT DOCUMENTS 6,406,556 B1 * 6/2002 Shimazawa et al. ........ 148/108
6,413,325 B1 * 7/2002 Koji et al. .................. 148/108
6,424,506 B1 * 7/2002 Saito et al. ............. 360/324.11

FOREIGN PATENT DOCUMENTS

JP      A-99-92907      4/1997

* cited by examiner

Primary Examiner—Stevan A. Resan
(74) Attorney, Agent, or Firm—Brinks Hofer Gilson & Lione

(57) ABSTRACT

A spin-valve magnetoresistive element includes an antiferromagnetic layer, a first pinned magnetic layer, a nonmagnetic interlayer, a second pinned magnetic layer, a nonmagnetic conductive layer, a free magnetic layer, a pair of longitudinal biasing layers, and a pair of lead layers. When a detecting current is applied from the lead layers, the magnetization vector of the free magnetic layer is aligned in a direction intersecting the magnetization vector of the second pinned magnetic layer, and the magnetization vector of the second pinned magnetic layer is tilted by an angle θ from the normal of a track width direction toward a direction opposite to a longitudinal biasing magnetic field, in order to reduce asymmetry of the output.

43 Claims, 17 Drawing Sheets

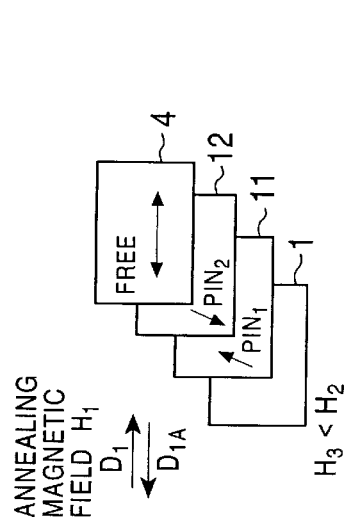
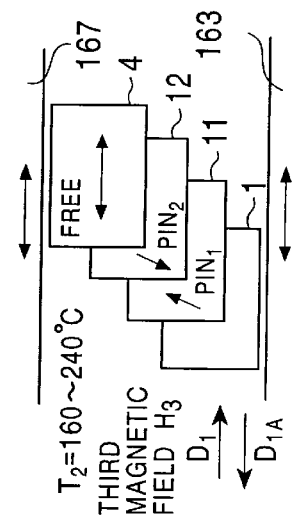
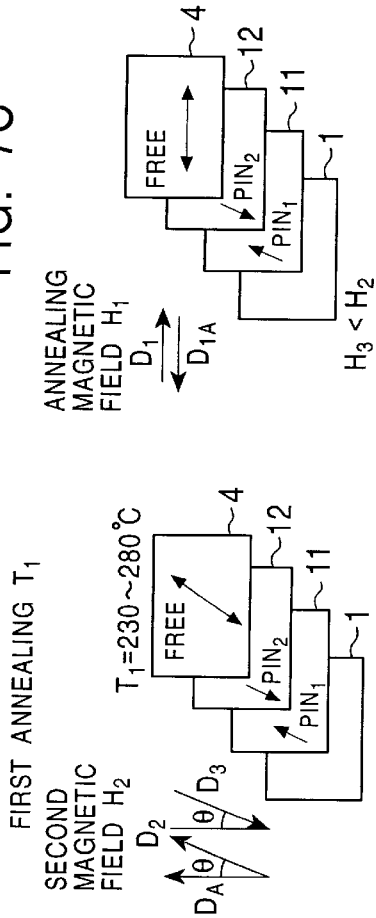
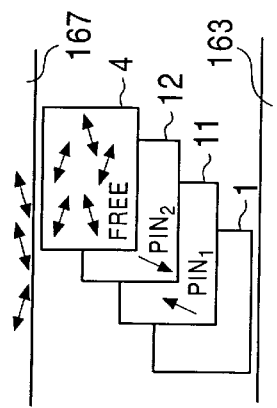
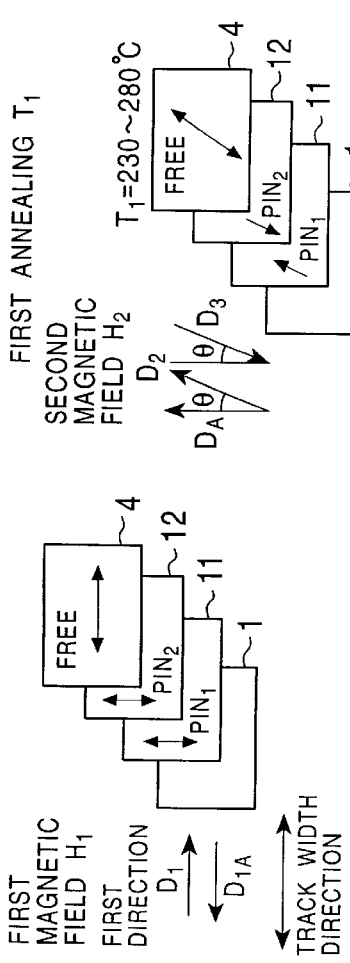
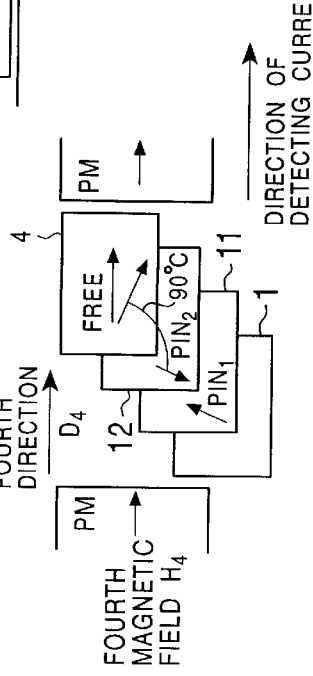

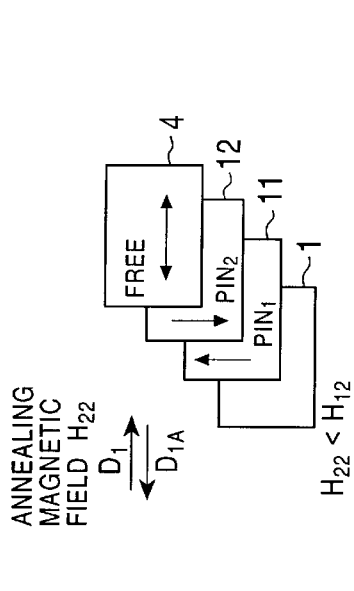
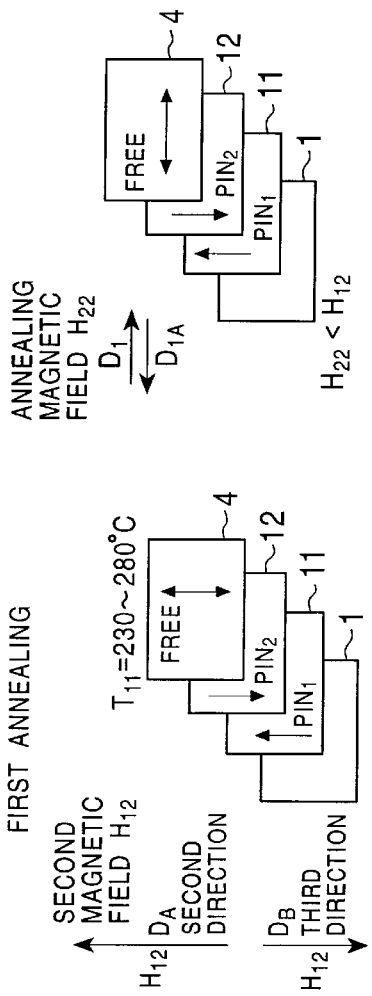
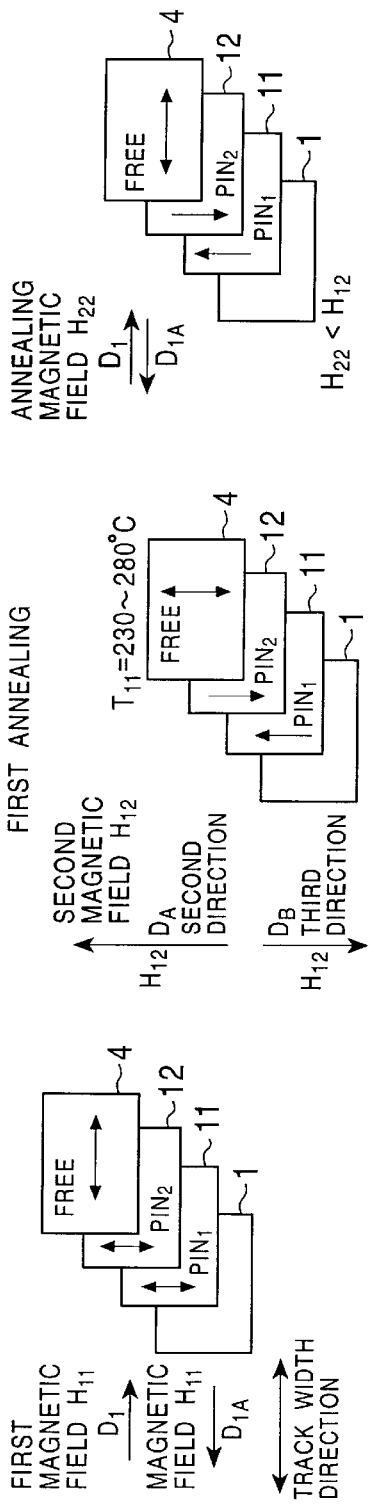
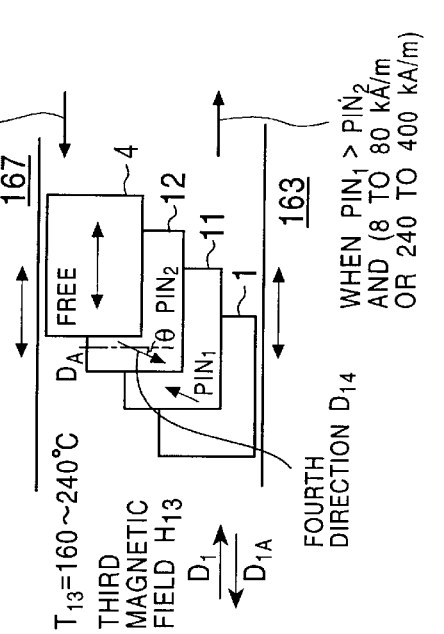
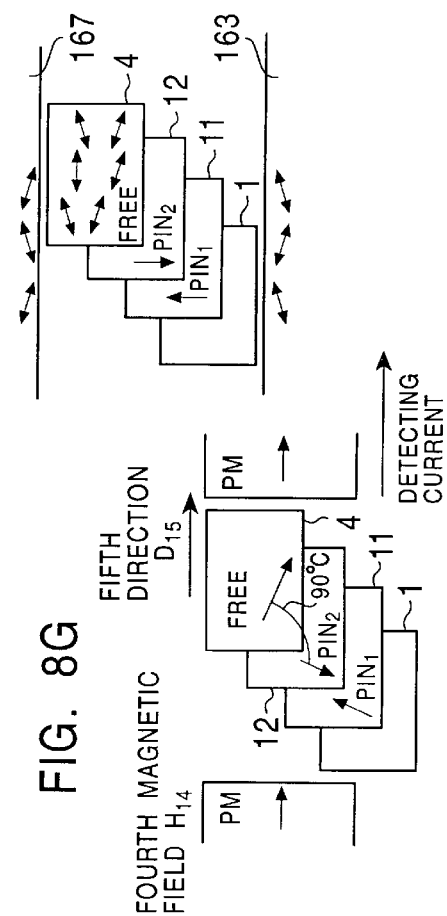

FIG. 9
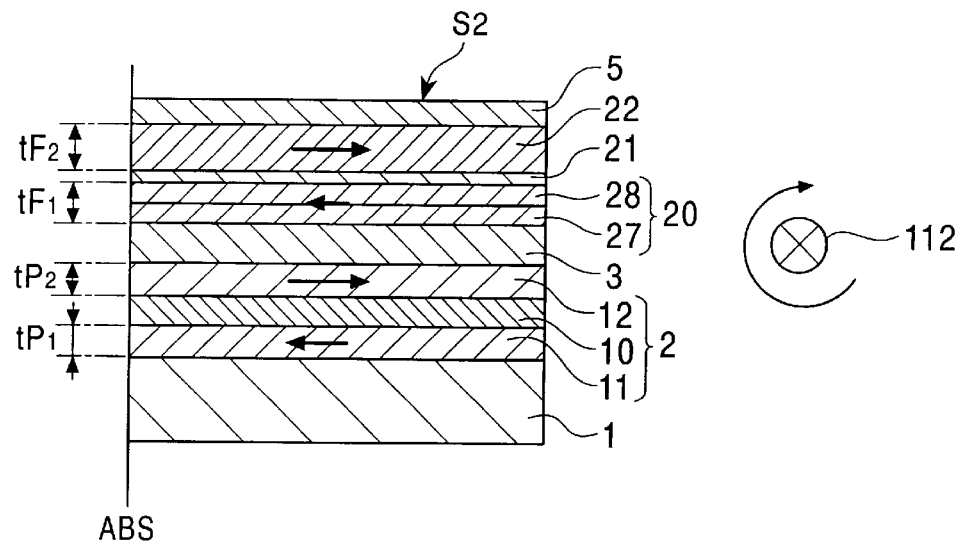
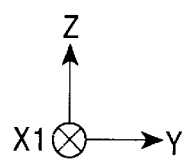
FIG. 10
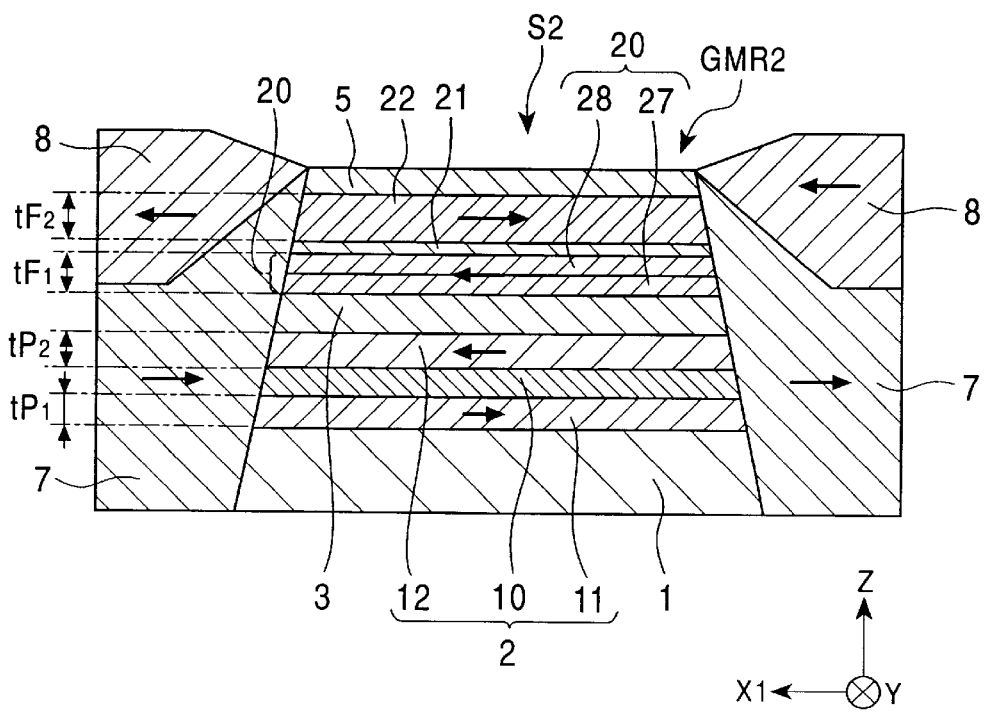

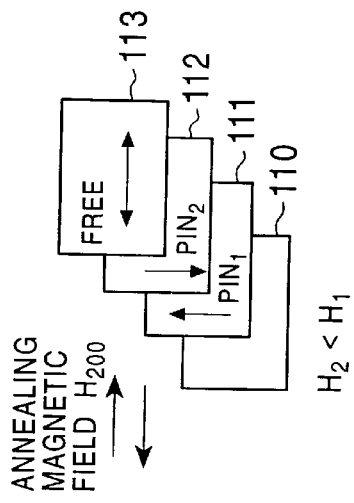
FIG. 25A PRIOR ART
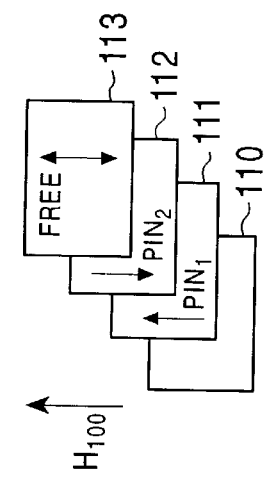
FIG. 25B PRIOR ART
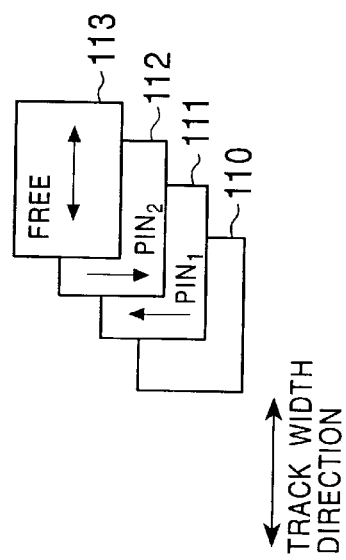
FIG. 25C PRIOR ART
FIG. 25D PRIOR ART
FORMATION OF WRITE HEAD
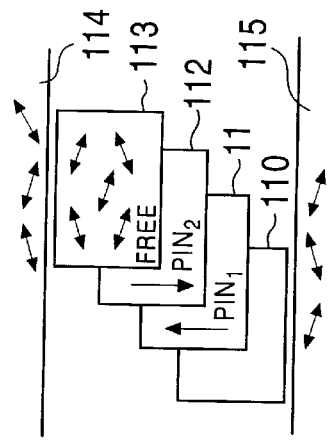
FIG. 25E PRIOR ART

SPIN-VALVE MAGNETORESISTIVE ELEMENT AND METHOD FOR MAKING THE SAME

BACKGROUND OF THE INVENTION

1. Field of the Invention

The present invention relates to spin-valve magnetoresistive elements exhibiting variable electrical resistance in response to the relationship between the magnetization vector of a free magnetic layer and the magnetization vector of a pinned magnetic layer, relates to thin-film magnetic heads provided therewith, and relates to methods for making the same. In particular, the present invention relates to a structure of a spin-valve magnetoresistive element having two separated pinned magnetic layers and relates to a technology for reducing asymmetry when a detecting current magnetic field is applied.

2. Description of the Background

Anisotropic magnetoresistive (AMR) heads using anisotropic magnetoresistive effects and giant magnetoresistive (GMR) heads using spin-dependent scattering phenomena of conduction electrons are known as magnetoresistive reading (MR) heads. One of the known GMR heads is a spin-valve head exhibiting a high magnetoresistive effect with respect to a low external magnetic field.

FIG. 22 is a cross-sectional view of a conventional spin-valve magnetoresistive element when viewed from a face opposing a recording medium. In this spin-valve magnetoresistive element, an antiferromagnetic layer 102 and a pinned magnetic layer 103 are deposited on a substrate 101, in that order. The pinned magnetic layer 103 is in contact with the antiferromagnetic layer 102, and an exchange coupling magnetic field (exchange anisotropic magnetic field) is generated at the interface between the pinned magnetic layer 103 and the antiferromagnetic layer 102. The pinned magnetic layer 103 is magnetized, for example, in the Y direction in the drawing.

A nonmagnetic conductive layer 104 composed of copper or the like is formed on the pinned magnetic layer 103, and free magnetic layer 105 is formed on the nonmagnetic conductive layer 104. Hard biasing layers 106 formed of, for example, a cobalt-platinum (CoPt) alloy, are formed on both sides of the free magnetic layer 105 and are magnetized in the X direction in the drawing so that the free magnetic layer 105 is aligned to a single-domain state in the X direction. Thus, the variable magnetization of the free magnetic layer 105 and the pinned magnetization of the pinned magnetic layer 103 are substantially orthogonal to each other. Current lead layers 108 are provided on the hard biasing layers 106.

In this spin-valve magnetoresistive element, a detecting current (sensing current) from the current lead layers 108 flows in the element. When the magnetization vector of the free magnetic layer 105 varies with a fringing magnetic field from a magnetic recording medium such as a hard disk, the electrical resistance varies due to the relationship with the pinned magnetization direction of the pinned magnetic layer 103. Thus, the spin-valve magnetoresistive element detects the fringing magnetic field from the magnetic recording medium as a variable voltage due to the variable electrical resistance.

It is preferable that asymmetry of the output waveform be as small as possible in the spin-valve magnetoresistive element. The asymmetry is determined by the relationship between the variable magnetization vector of the free magnetic layer 105 and the pinned magnetization vector of the pinned magnetic layer 103. When no external magnetic field is applied, it is preferable that the variable magnetization vector of the free magnetic layer 105 be orthogonal to the pinned magnetization vector of the pinned magnetic layer 103.

With reference to a schematic view in shown in FIG. 23, the variable magnetization vector of the free magnetic layer 105, which affects the output asymmetry, will be described. In the spin-valve magnetoresistive element, which reads magnetic information with a detecting current, the magnetization of the free magnetic layer 105 is affected by a demagnetizing field (dipole magnetic field) $H_d$ generated by the magnetization $M_p$ of the pinned magnetic layer 103, a detecting current magnetic field (sensing current magnetic field) $H_j$ due to the detecting current J, and an interactive magnetic field $H_{int}$ due to interlayer interaction between the free magnetic layer 105 and the pinned magnetic layer 103 (a magnetic field, which affects so that the magnetization of the pinned magnetic layer 103 and the magnetization of the free magnetic layer 105 are parallel to each other).

It is considered that the asymmetry is reduced when these magnetic fields are relatively small with respect to the variable magnetization $M_f$ of the free magnetic layer 105. Thus, when no external magnetic field is applied, canceling these magnetization vectors, as represented by the following equation, minimizes the asymmetry:

$$H_j + H_d + H_{int} = 0$$

As shown in FIG. 23, the magnetization of the free magnetic layer 105, the detecting current magnetic field $H_j$ and the interactive magnetic field $H_{int}$ are in the same direction, whereas the demagnetizing field $H_d$ is in a different direction. Thus, in order to minimize the asymmetry, such a spin-valve magnetoresistive element is preferably produced so as to satisfy the equation $H_d = H_j + H_{int}$ based on the above relationship.

With reference to FIGS. 25A to 25E, a method for making a spin-valve magnetoresistive element of a composite ferri-pinned structure shown in FIG. 24 will be described. As shown in FIG. 24, in the composite ferri-pinned structure, the pinned magnetic layer is divided into a first pinned magnetic layer 111 and a second pinned magnetic layer 112. In FIGS. 25A to 25E, only an antiferromagnetic layer 110, the first pinned magnetic layer 111, the second pinned magnetic layer 112, and a free magnetic layer 113 are depicted for simplicity, and thus a nonmagnetic interlayer provided between the first pinned magnetic layer 111 and the second pinned magnetic layer 112 and a nonmagnetic conductive layer provided between the second pinned magnetic layer 112 and the free magnetic layer 113 are not depicted. Moreover, the depicted layers are shifted to show magnetization vectors of these layers. The magnetic thickness of the first pinned magnetic layer 111 is smaller than the magnetic thickness of the second pinned magnetic layer 112 in which the magnetic thickness corresponds to the product of the intensity of the magnetization and the thickness.

The spin-valve magnetoresistive element shown in FIG. 24 is produced as follows. The antiferromagnetic layer 110 composed of PtMn or the like, the first pinned magnetic layer 111 composed of Co or the like, the nonmagnetic interlayer (not shown in the drawing), the second pinned magnetic layer 112 composed of Co or the like, the nonmagnetic conductive layer (not shown in the drawing), and the free magnetic layer 113 composed of NiFe or the like are deposited on a substrate to form a composite. In this process, the first pinned magnetic layer 111 and the second pinned magnetic layer 112 are deposited while a magnetic field is applied in a direction perpendicular to the track width direction, then the nonmagnetic conductive layer is formed. Moreover, the first pinned magnetic layer 111 is formed while a magnetic field is applied in the track width direction. As a result, as shown in FIG. 25A, the magnetization vector of the first pinned magnetic layer 111 and the magnetization vector of the second pinned magnetic layer 112 are orthogonal to the magnetization vector of the free magnetic layer 113.

With reference to FIG. 25B, the composite is annealed while an annealing magnetic field $H_{100}$ of 400 kA/m or more, which is perpendicular to the track width direction, is applied so that the PtMn antiferromagnetic layer 110 has an ordered structure. After the annealing, an intense exchange coupling magnetic field (exchange anisotropic magnetic field) occurs at the interface between the PtMn antiferromagnetic layer 110 and the first pinned magnetic layer 111. As a result, the magnetization vector of the first pinned magnetic layer 111 is pinned in the direction of the annealing magnetic field $H_{100}$, which is perpendicular to the track width direction. After the annealing magnetic field is removed, the magnetization vector of the second pinned magnetic layer 112 is pinned in a direction, which is opposite to the annealing magnetic field $H_{100}$, due to an exchange coupling magnetic field generated between the first pinned magnetic layer 111 and the second pinned magnetic layer 112 by the RKKY interaction. Moreover, this annealing in the magnetic field aligns the vector of the magnetic anisotropy in the free magnetic layer 113 in a direction perpendicular to the track width direction as shown in FIG. 25B.

With reference to FIG. 25C, the composite is annealed while an annealing magnetic field $H_{200}$ is applied in the track width direction so that the vector of the uniaxial anisotropy is aligned along the annealing magnetic field $H_{200}$. As a result, the magnetization vector of the first pinned magnetic layer 111 and the magnetization vector of the second pinned magnetic layer 112 are orthogonal to the anisotropic magnetic field of the free magnetic layer 113. The vector of the annealing magnetic field $H_{200}$ may be either the right or the left.

In the single pinned magnetic layer configuration shown in FIG. 23, the demagnetizing field is large at edges of the element. Thus, a leakage magnetic field to the exterior is large, and the pinning force acting from the antiferromagnetic layer 102 to the pinned magnetic layer 103 is not large. The spin-valve magnetoresistive element having the composite ferri-pinned structure shown in FIG. 24 has been developed to solve the above problem. As shown in FIG. 24, the magnetization vector of the first pinned magnetic layer 111 and the magnetization vector of the second pinned magnetic layer 112 are antiparallel to each other and the magnetic moment of one of these is larger than the magnetic moment of the other. Thus, a strong pinning force is achieved by an effective magnetostatic coupling magnetic field from the antiferromagnetic layer 110 to these two pinned magnetic layers.

In the spin-valve magnetoresistive element of the composite ferri-pinned structure shown in FIG. 24, the fringing magnetic field of the first pinned magnetic layer compensates for most of the fringing magnetic field of the two pinned magnetic layers to reduce the effect of the demagnetizing field (dipole magnetic field) $H_d$ on the free magnetic layer 113. Since the demagnetizing field $H_d$ is reduced in such a mechanism, the detecting current magnetic field $H_j$ is larger than the demagnetizing field $H_d$. Thus, it is difficult to reduce the asymmetry since the detecting current magnetic field $H_j$ is too large to compensate for the demagnetizing field $H_d$. In particular, when the demagnetizing field $H_d$ is small in the composite structure shown in FIG. 24, the detecting current magnetic field $H_j$ affects the magnetization vector of the free magnetic layer 105. That is, the magnetization vector of the free magnetic layer 105 tilts toward the lower right side, as shown by the vector $M_{f1}$ in FIG. 24. As a result, the orthogonal magnetizations of the first pinned magnetic layer 111 and the second pinned magnetic layer 112 are not achieved.

When the demagnetizing field $H_d$ is increased so as to be balanced with the detecting current magnetic field $H_j$ in order to reduce asymmetry, the pinning force of the antiferromagnetic layer 110 to the first pinned magnetic layer 111 and the second pinned magnetic layer 112 is decreased. Accordingly, the control of the asymmetry in the spin-valve magnetoresistive element having the composite ferri-pinned structure requires another mechanism.

A thin-film magnetic head having the spin-valve magnetoresistive element as a reading element generally has a composite configuration including an inductive element (magnetic inductive head) as a writing element. The write head has an inductive coil for recording, and a magnetic pole for writing formed of a magnetic film and a magnetic gap provided at the edge of the inductive coil. An insulating layer formed of resin is provided to insulate the inductive coil from other layers. In the formation of the insulating resin layer for covering the inductive coil, an uncured resin is applied and is cured by heat. After the uniaxial anisotropy is imparted to the free magnetic layer 113 as shown in FIG. 25C, the write head is formed, and then these are annealed together with an upper shield 114 and a lower shield 115. The annealing temperature exceeds 473 K (200° C.) for achieving curing of the resin. Such a high annealing temperature disorders the uniaxial anisotropy in the free magnetic layer 113, resulting in the generation of Barkhausen noise, as shown in FIG. 25E. Thus, the reading head does not have desired characteristics.

In the thin-film magnetic head, the upper shield 114 provided on the magnetoresistive element also functions as a lower core layer of the write head (inductive head). When disorder of the uniaxial anisotropy in the free magnetic layer 113 and the disorder of the magnetization easy axis in the upper shield 114 simultaneously occur in such a configuration, the magnetization, that is, the magnetic domain structure, of the upper shield 114 is irreversibly varied with recording of magnetic information on a magnetic recording medium by the inductive head. An unstable magnetic field generated by the irreversible magnetic domain will result in unstable read output from the magnetoresistive element.

SUMMARY OF THE INVENTION

It is an object of the present invention to provide a spin-valve magnetoresistive element exhibiting reduced asymmetry in which the magnetization vectors of pinned magnetic layers and a free magnetic layer are aligned to predetermined directions when a detecting current magnetic field is applied.

It is another object of the present invention to provide a thin-film magnetic head using the spin-valve magnetoresistive element.

It is another object of the present invention to provide a spin-valve magnetoresistive element having a composite ferri-pinned structure which exhibits reduced asymmetry, a thin-film magnetic head having the spin-valve magnetoresistive element, a method for making the spin-valve magnetoresistive element, and a method for making the thin-film magnetic head.

It is another object of the present invention to provide a spin-valve magnetoresistive element exhibiting reduced asymmetry in which the directions of applied magnetic fields are adjusted when individual layers are magnetized in response to the relationship between the magnetic thickness of the first pinned magnetic layer and the magnetic thickness of the second pinned magnetic layer.

According to a first aspect of the present invention, a spin-valve magnetoresistive element includes: an antiferromagnetic layer; a first pinned magnetic layer in contact with the antiferromagnetic layer, an exchange anisotropic magnetic field being formed between the antiferromagnetic layer and the first pinned magnetic layer for pinning the magnetization vector of the first pinned magnetic layer; a nonmagnetic interlayer; a second pinned magnetic layer, the nonmagnetic interlayer being disposed between the first pinned magnetic layer and the second pinned magnetic layer, the magnetization vector of the second pinned magnetic layer being aligned in a direction antiparallel to the magnetization vector of the first pinned magnetic layer; a nonmagnetic conductive layer in contact with the second pinned magnetic layer; a free magnetic layer in contact with the nonmagnetic conductive layer; longitudinal biasing layers for applying a longitudinal biasing magnetic field in a track width direction to the free magnetic layer; and a pair of lead layers for supplying a detecting current to the second pinned magnetic layer, the nonmagnetic conductive layer, and the free magnetic layer; wherein, when the detecting current is supplied from the lead layers, the magnetization vector of the free magnetic layer is aligned in a direction intersecting the magnetization vector of the second pinned magnetic layer, and the magnetization vector of the second pinned magnetic layer is tilted from the direction perpendicular to the track width direction toward a direction opposite to the longitudinal biasing magnetic field.

When the detecting current is applied, the magnetization vector of the free magnetic layer and the magnetization vectors of the pinned magnetic layers intersect with a predetermined angle. This configuration produces a large change in resistance when an external magnetic field is applied from a magnetic recording medium compared to a state where no external magnetic field is applied. Moreover, the asymmetry of the output from the magnetic information on a magnetic recording medium is reduced.

According to a second aspect of the present invention, a spin-valve magnetoresistive element includes an antiferromagnetic layer; a first pinned magnetic layer in contact with the antiferromagnetic layer, an exchange anisotropic magnetic field being formed between the antiferromagnetic layer and the first pinned magnetic layer for pinning the magnetization vector of the first pinned magnetic layer; a nonmagnetic interlayer; a second pinned magnetic layer, the nonmagnetic interlayer being disposed between the first pinned magnetic layer and the second pinned magnetic layer, the magnetization vector of the second pinned magnetic layer being aligned in a direction antiparallel to the magnetization vector of the first pinned magnetic layer; a nonmagnetic conductive layer in contact with the second pinned magnetic layer; a free magnetic layer in contact with the nonmagnetic conductive layer; longitudinal biasing layers for applying a longitudinal biasing magnetic field in a track width direction to the free magnetic layer; and a pair of lead layers for supplying a detecting current to the second pinned magnetic layer, the nonmagnetic conductive layer, and the free magnetic layer; wherein, when the detecting current is supplied from the lead layers, the magnetization vector of the free magnetic layer is aligned in a direction intersecting the magnetization vector of the second pinned magnetic layer, and the magnetization vector of the free magnetic layer is tilted from the track width direction toward the magnetization vector of the second pinned magnetic layer.

When the detecting current is applied, the magnetization vector of the free magnetic layer and the magnetization vectors of the pinned magnetic layers intersect with a predetermined angle. Thus, the asymmetry of the output from the magnetic information on a magnetic recording medium is reduced.

In the first and second aspects, the angle of tilt of the free magnetic layer, $\theta$, is preferably in a range of 2° to 30°, more preferably 3° to 15°, and most preferably 3° to 10°. The asymmetry can be more effectively reduced within the range without reducing the output. At an angle exceeding this range, the output is reduced. At an angle of less than this range, the asymmetry is not significantly improved.

When the detecting current is supplied and when no external magnetic field is applied, the angle defined by the magnetization vector of the free magnetic layer and the magnetization vector of the second pinned magnetic layer is preferably 90°. The magnetization vector of the free magnetic layer is tilted by the effect of the detecting current magnetic field due to the detecting current. Since the magnetization vector of the second pinned magnetic layer and the tilted magnetization vector of the second pinned magnetic layer are orthogonal to each other, the asymmetry is most effectively reduced while maintaining high output.

Preferably, the magnetic thickness of the first pinned magnetic layer is smaller than the magnetic thickness of the second pinned magnetic layer, the direction of the detecting current magnetic field applied to the free magnetic layer is opposite to the magnetization vector of the second pinned magnetic layer, and the direction of the detecting current magnetic field applied to the second pinned magnetic layer is opposite to the magnetization vector of the second pinned magnetic layer, where the magnetic thickness is defined as the product of the saturation magnetization and the thickness. This configuration stabilizes the magnetization vector of the first pinned magnetic layer and the magnetization vector of the second pinned magnetic layer, and produces a large change rate of resistance $\Delta R/R$.

Preferably, the antiferromagnetic layer includes one of an XMn alloy and an XMnX' alloy, wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

Since these alloys have higher blocking temperatures than those of conventional antiferromagnetic materials such as FeMn, the resulting spin-valve magnetoresistive element is thermally stable.

Preferably, the overall exchange anisotropic magnetic field of the antiferromagnetic layer affecting a composite pinned magnetic layer including the first pinned magnetic layer and the second pinned magnetic layer is 96 kA/m or more. When the overall exchange anisotropic magnetic field has such a high value, a hard biasing magnetic field from the longitudinal biasing layers does not extraordinarily tilt the magnetization of the pinned magnetic layer at the peripheral portions.

Preferably, the antiferromagnetic layer, the first pinned magnetic layer, the nonmagnetic interlayer, the second pinned magnetic layer, and the free magnetic layer are deposited in that order on a substrate. In the bottom-type spin-valve magnetoresistive element in which the antiferromagnetic layer is deposited near the substrate, the anisotropic magnetic field of the pinned magnetic layer can be increased.

Preferably, the free magnetic layer comprises a first free magnetic layer and a second free magnetic layer separated by a conductive interlayer provided therebetween.

Alternatively, the free magnetic layer, the nonmagnetic conductive layer, the second pinned magnetic layer, the conductive interlayer, the first pinned magnetic layer, and the antiferromagnetic layer are deposited in that order on a substrate.

According to a third aspect of the present invention, a method for making a spin-valve magnetoresistive element includes: a composite forming step for forming a composite having an antiferromagnetic layer, a first pinned magnetic layer, a nonmagnetic interlayer, a second pinned magnetic layer, a nonmagnetic conductive layer, and a free magnetic layer on a substrate, the free magnetic layer being formed while applying a first magnetic field in one of a first direction along a track width direction and a direction opposite to the first direction to impart uniaxial anisotropy in the track width direction to the free magnetic layer; a first annealing step for annealing the composite at a first annealing temperature while applying a second magnetic field in one of a second direction tilted by an angle θ from the normal of the track width direction and a third direction opposite to the second direction to generate an exchange anisotropic magnetic field at the interface between the antiferromagnetic layer and the first pinned magnetic layer, to pin the magnetization of the first pinned magnetic layer and the magnetization of the second pinned magnetic layer in directions which are tilted by the angle θ from the normal of the track width direction and which are antiparallel to each other; a biasing layer forming step for forming longitudinal biasing layers, for applying a biasing magnetic field to the free magnetic layer, on both sides of the laminate; a second annealing step for annealing the laminate at a second annealing temperature while applying a third magnetic field to the free magnetic layer in one of the first direction and a direction opposite to the first direction to impart uniaxial anisotropy to the free magnetic layer; and a biasing layer magnetizing step for applying a fourth magnetic field in a fourth direction opposite to the component in the track width direction of the magnetization vector of the second pinned magnetic layer to magnetize the longitudinal biasing layers.

The first annealing step at the first annealing temperature while applying the second magnetic field in the second direction pins the magnetization vector of the first pinned magnetic layer with a tilt angle θ. Next, the uniaxial anisotropy of the free magnetic layer is aligned in the track width direction during the second annealing step so that the magnetization vector of the pinned magnetic layer and the free magnetic layer intersect each other when the detecting current magnetic field is applied.

When the magnetic thickness of the first pinned magnetic layer is smaller than the magnetic thickness of the second pinned magnetic layer, the intensity of the second magnetic field may be 400 kA/m or more so as to align the magnetization vector of the first pinned magnetic layer in the second direction and the magnetization vector of the second pinned magnetic layer in the third direction, or the intensity of the second magnetic field may be 8 to 80 kA/m so as to align the magnetization vector of the first pinned magnetic layer in the third direction and the magnetization vector of the second pinned magnetic layer in the second direction, where the magnetic thickness is defined as the product of the magnetic moment and the thickness of the corresponding pinned magnetic layer.

When the magnetic thickness of the first pinned magnetic layer is larger than the magnetic thickness of the second pinned magnetic layer, the intensity of the second magnetic field may be 400 kA/m or more so as to align the magnetization vector of the first pinned magnetic layer in the second direction and the magnetization vector of the second pinned magnetic layer in the third direction, or the intensity of the second magnetic field may be 8 to 80 kA/m so as to align the magnetization vector of the first pinned magnetic layer in the second direction and the magnetization vector of the second pinned magnetic layer in the second direction, where the magnetic thickness is defined as the product of the magnetic moment and the thickness of the corresponding pinned magnetic layer.

The method for making a spin-valve magnetoresistive element may further comprises a recording head annealing step for forming an inductive recording magnetic head onto the composite, the recording head annealing step being provided between the first annealing step and the second annealing step. The annealing step for forming the inductive recording magnetic head disorders the uniaxial anisotropy of the free magnetic layer, but the subsequent second annealing step aligns the uniaxial anisotropy of the free magnetic layer. Thus, the spin-valve magnetoresistive element has a uniaxially anisotropic free magnetic layer.

The method for making a spin-valve magnetoresistive element may further comprise an additional annealing step, prior to the recording head annealing step, for annealing the composite while applying a magnetic field to the free magnetic layer in one of the first direction and the direction opposite to the first direction to impart uniaxial anisotropy in the track width direction to the free magnetic layer.

Preferably, the third magnetic field applied in the second annealing step is smaller than the second magnetic field applied in the first annealing step. Since the third magnetic field is smaller than the second magnetic field, the uniaxial anisotropy of the free magnetic layer is aligned without adversely affecting the magnetization vector of the pinned magnetic layer.

Preferably, the intensity of the third magnetic field applied in the second annealing step is 8 kA/m to 40 kA/m.

Preferably, the first annealing temperature is in a range of 230° C. (503 K) to 280° C. (553 K) and the second annealing temperature is in a range of 160° C. (433 K) to 240° C. (513 K).

Preferably, the antiferromagnetic layer includes one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

The antiferromagnetic layer may be disposed between the substrate and the free magnetic layer in the composite.

According to a fourth aspect of the present invention, a method for making a spin-valve magnetoresistive element includes: a composite forming step for forming a composite having an antiferromagnetic layer, a first pinned magnetic layer, a nonmagnetic interlayer, a second pinned magnetic layer, a nonmagnetic conductive layer, and a free magnetic layer on a substrate, the free magnetic layer being formed while applying a first magnetic field in one of a first direction along a track width direction and a direction opposite to the first direction to impart uniaxial anisotropy in the track width direction to the free magnetic layer; a first annealing step for annealing the composite at a first annealing temperature while applying a second magnetic field in a second direction orthogonal to the track width direction to generate an exchange anisotropic magnetic field at the interface between the antiferromagnetic layer and the first pinned magnetic layer so as to pin the magnetization of the first pinned magnetic layer and the magnetization of the second pinned magnetic layer in a direction orthogonal to the track width direction; a biasing layer forming step for forming longitudinal biasing layers, for applying a biasing magnetic field to the free magnetic layer, on both sides of the laminate; a second annealing step for annealing the laminate at a second annealing temperature while applying a third magnetic field to the free magnetic layer in one of the first direction and a direction opposite to the first direction to impart uniaxial anisotropy to the free magnetic layer and to tilt by an angle θ from the normal of the track width direction the magnetization vector of the first pinned magnetic layer and the magnetization vector of the second pinned magnetic layer; and a biasing layer magnetizing step for applying a fourth magnetic field in a fourth direction opposite to the component in the track width direction of the magnetization vector of the second pinned magnetic layer to magnetize the longitudinal biasing layers.

The first annealing step while applying the second magnetic field in the second direction pins the magnetization vector of the first pinned magnetic layer in contact with the antiferromagnetic layer and the magnetization vector of the second pinned magnetic layer in a direction orthogonal to the track width direction. The subsequent annealing in the magnetic field applied in the track width direction tilts the magnetization vectors of the pinned magnetic layers by an angle θ from the direction orthogonal to the track width direction. Thus, in the spin-valve magnetoresistive element, the magnetization vectors of the pinned magnetic layers and the magnetization vector of the free magnetic layer intersect each other when a dipole magnetic field is applied.

When the magnetic thickness of the first pinned magnetic layer is larger than the magnetic thickness of the second pinned magnetic layer, the magnetization vector of the first pinned magnetic layer is aligned in the second direction, and the magnetization vector of the second pinned magnetic layer is aligned in a direction opposite to the second direction, where the magnetic thickness is defined as the product of the magnetic moment and the thickness of the corresponding pinned magnetic layer.

When the magnetic thickness of the first pinned magnetic layer is larger than the magnetic thickness of the second pinned magnetic layer, the intensity of the second magnetic field may be 400 kA/m or more so as to align the magnetization vector of the first pinned magnetic layer in the second direction and the magnetization vector of the second pinned magnetic layer in a third direction opposite to the second direction, or the intensity of the second magnetic field may be 8 to 80 kA/m so as to align the magnetization vector of the first pinned magnetic layer in the second direction and the magnetization vector of the second pinned magnetic layer in the third direction, where the magnetic thickness is defined as the product of the magnetic moment and the thickness of the corresponding pinned magnetic layer.

When the magnetic thickness of the first pinned magnetic layer is smaller than the magnetic thickness of the second pinned magnetic layer, the intensity of the second magnetic field may be 400 kA/m or more so as to align the magnetization vector of the first pinned magnetic layer in the second direction and the magnetization vector of the second pinned magnetic layer in a third direction opposite to the second direction, or the intensity of the second magnetic field may be 8 to 80 kA/m so as to align the magnetization vector of the first pinned magnetic layer in the third direction and the magnetization vector of the second pinned magnetic layer in the second direction, where the magnetic thickness is defined as the product of the magnetic moment and the thickness of the corresponding pinned magnetic layer.

The method for making a spin-valve magnetoresistive element may further include a recording head annealing step for forming an inductive recording magnetic head onto the composite, the recording head annealing step being provided between the first annealing step and the second annealing step. The annealing step for forming the inductive recording magnetic head disorders the uniaxial anisotropy of the free magnetic layer, but the subsequent second annealing step aligns the uniaxial anisotropy of the free magnetic layer. Thus, the spin-valve magnetoresistive element has a uniaxially anisotropic free magnetic layer.

Preferably, the third magnetic field applied in the second annealing step is smaller than the second magnetic field applied in the first annealing step.

Preferably, the first annealing temperature is in a range of 230° C. (503 K) to 280° C. (553 K) and the second annealing temperature is in a range of 160° C. (433 K) to 240° C. (513 K).

Preferably, the antiferromagnetic layer includes one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

The antiferromagnetic layer may be disposed between the substrate and the free magnetic layer in the composite.

In the present invention, a thin-film magnetic head is produced by a step for forming a spin-valve magnetoresistive element as a read element and by a step for forming an inductive read magnetic head on the spin-valve magnetoresistive element.

BRIEF DESCRIPTION OF THE DRAWINGS

FIGS. 7A to 7G are schematic views for illustrating a first production method in accordance with the present invention;

FIGS. 8A to 8G are schematic views for illustrating a second production method in accordance with the present invention;

FIG. 9 is a cross-sectional view of a second embodiment of a spin-valve magnetoresistive element in accordance with the present invention;

FIG. 10 is a cross-sectional view of the spin-valve magnetoresistive element shown in FIG. 9, when viewed from a face opposing a magnetic recording medium;

FIGS. 25A to 25E are schematic views for illustrating a method for making a conventional spin-valve magnetoresistive element including a pinned magnetic layer having a double layer configuration.

DETAILED DESCRIPTION

First Embodiment

FIGS. 1, 2, 3A, and 3B show a first embodiment of a spin-valve magnetoresistive element provided in a thin-film magnetic head in accordance with the present invention. The spin-valve magnetoresistive element is provided in a floating thin-film magnetic head 150 shown in FIGS. 4 to 6 which is installed in a magnetic recording unit, such as a hard disk.

Figure 4:
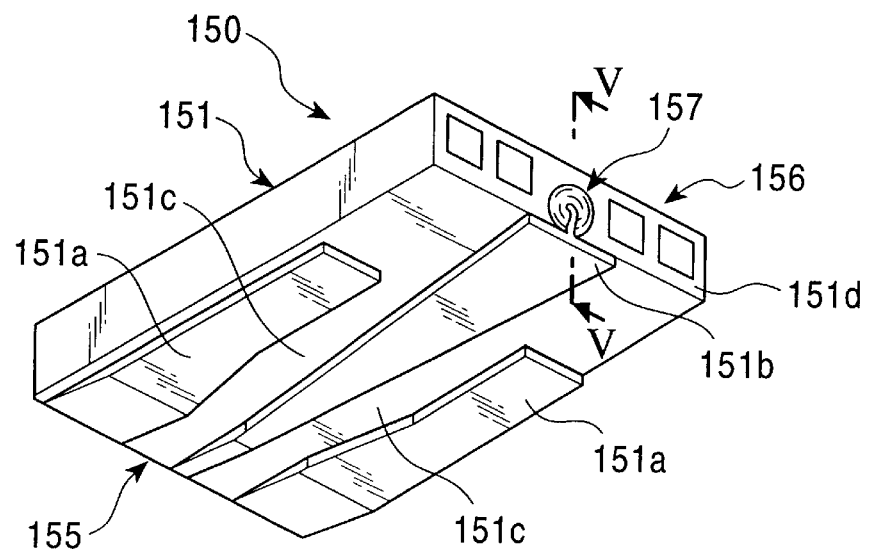
FIG. 4 is an isometric view of a magnetic head provided with the spin-valve magnetoresistive element shown in FIG. 1.

With reference to FIG. 4, a slider 151 of the thin-film magnetic head 150 has a leading end 155 upstream of the moving direction of a disk face and a trailing end 156 downstream of the moving direction. A face opposing the magnetic disk of the slider 151 includes oblong air bearing surfaces 151a and 151b, and air grooves 151c (hereinafter the air bearing surface is referred to as ABS). The slider 151 in this embodiment is formed of a nonmagnetic material such as ceramic, e.g., $Al_2O_3$—TiC. The slider 151 is provided with a magnetic core section 157 on a trailing end face 151d thereof.

Figure 5:
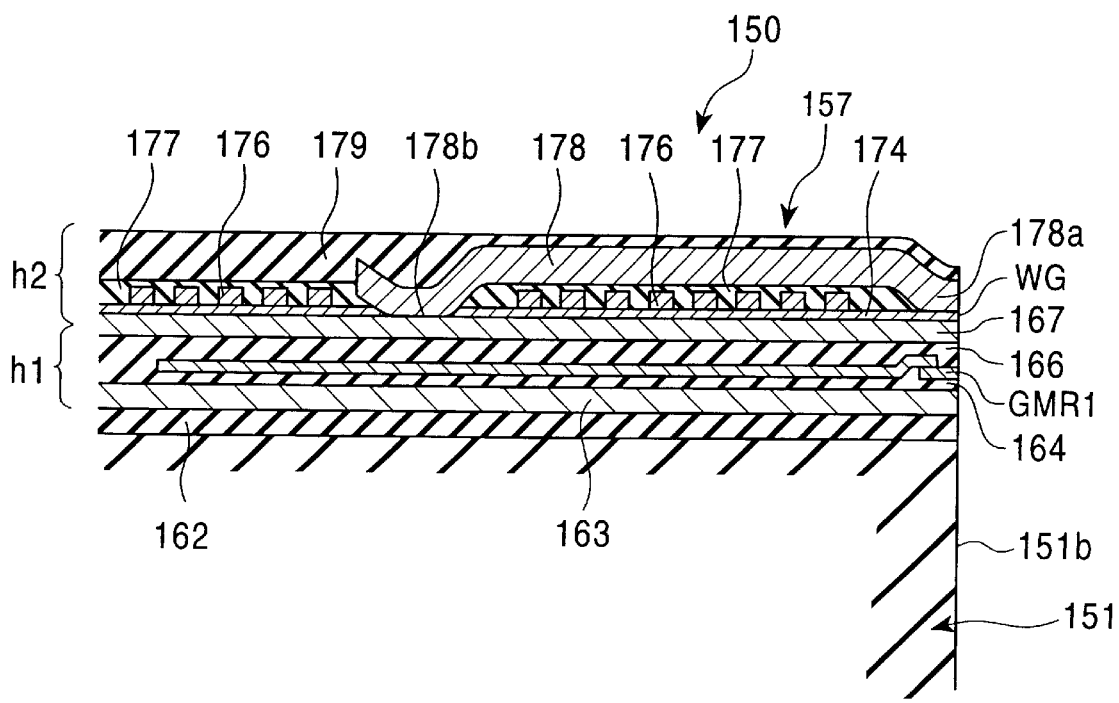
FIG. 5 is a cross-sectional view of the magnetic head shown in FIG. 4.
Figure 6:
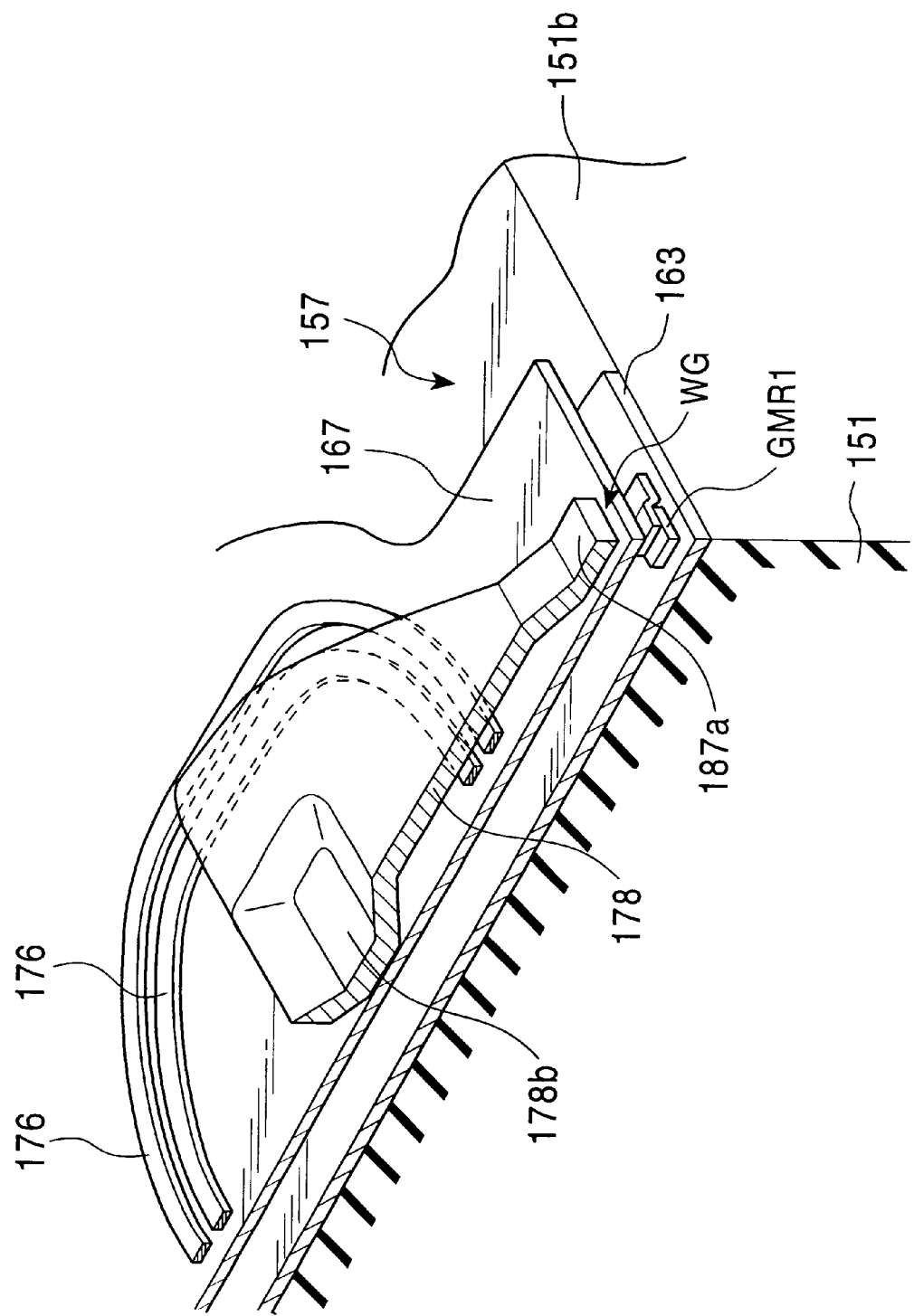
FIG. 6 is an isometric cross-sectional view of the magnetic head shown in FIG. 4.

The magnetic core section 157 has a composite magnetic core configuration having a cross-section shown in FIGS. 5 and 6. A read head (GMR head using the spin-valve magnetoresistive element) h1 and an inductive recording magnetic head (inductive head) h2 are deposited on the trailing end face 151d of the slider 151.

With reference to FIG. 5, the GMR head h1 has a protective layer 162 composed of an insulating material, such as alumina ($Al_2O_3$), which is formed in the trailing end of the slider 151. A lower shielding layer 163 composed of a magnetic alloy is formed on the protective layer 162, and a lower gap layer 164 composed of an insulating material, such as alumina, is formed on the lower shielding layer 163. A spin-valve magnetoresistive element GMR1 is formed at the ABS 151b side on the lower gap layer 164. An upper gap layer 166 is formed over the spin-valve magnetoresistive element GMR1 and the lower gap layer 164, and an upper shielding layer 167 is formed on the upper gap layer 166. The upper shielding layer 167 also functions as a lower core layer of the inductive head (inductive write head) h2 provided thereon.

In the inductive head h2, a gap layer 174 is formed on the upper shielding layer or lower core layer 167, and an induction coil 176 having a planar spiral pattern is formed on the gap layer 174. The induction coil 176 is surrounded by an insulating layer 177 composed of resin or the like. An upper core layer 178 is formed on the insulating layer 177. The upper core layer 178 opposes the lower core layer 167 with a magnetic writing gap WG on the ABS 151b at the magnetic pole end 178a and is magnetically coupled with the lower core layer 167 at the base end 178b. A protective layer 179 composed of alumina or the like is formed on the upper core layer 178.

The GMR head h1 reads information recorded on a magnetic recording medium, such as a hard disk, as a change in resistance of the spin-valve magnetoresistive element GMR1 which is caused by a small fringing magnetic field from the recording magnetic medium.

In the inductive head h2, a recording current is supplied to the core layers through the induction coil 176. The inductive head h2 records magnetic signals on the recording magnetic medium based on a fringing magnetic field from the edge of the lower core layer 167 and the edge of the upper core layer 178 at the magnetic writing gap WG section.

Figure 1:
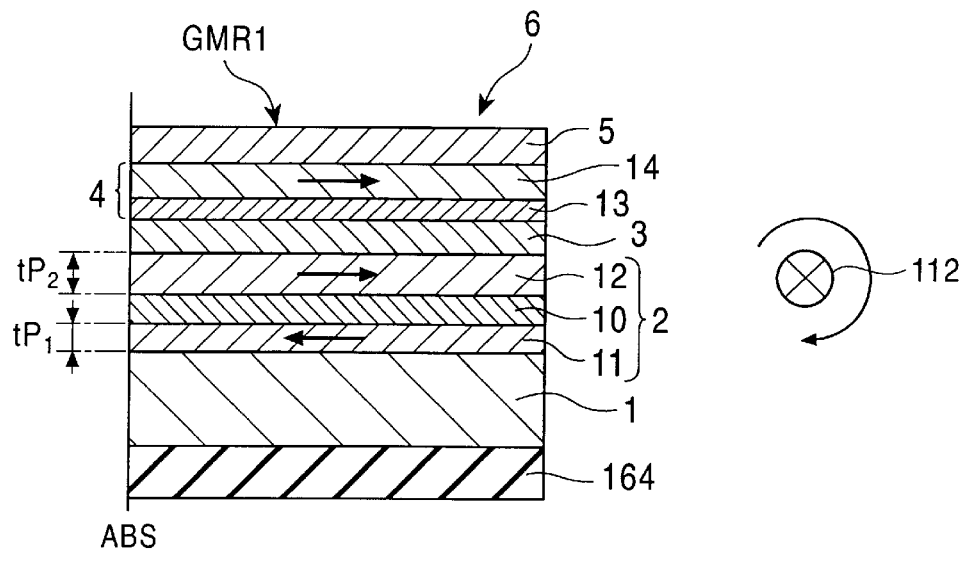
FIG. 1 is a transverse cross-sectional view of a composite structure of a spin-valve magnetoresistive element in accordance with the present invention.
Figure 2:
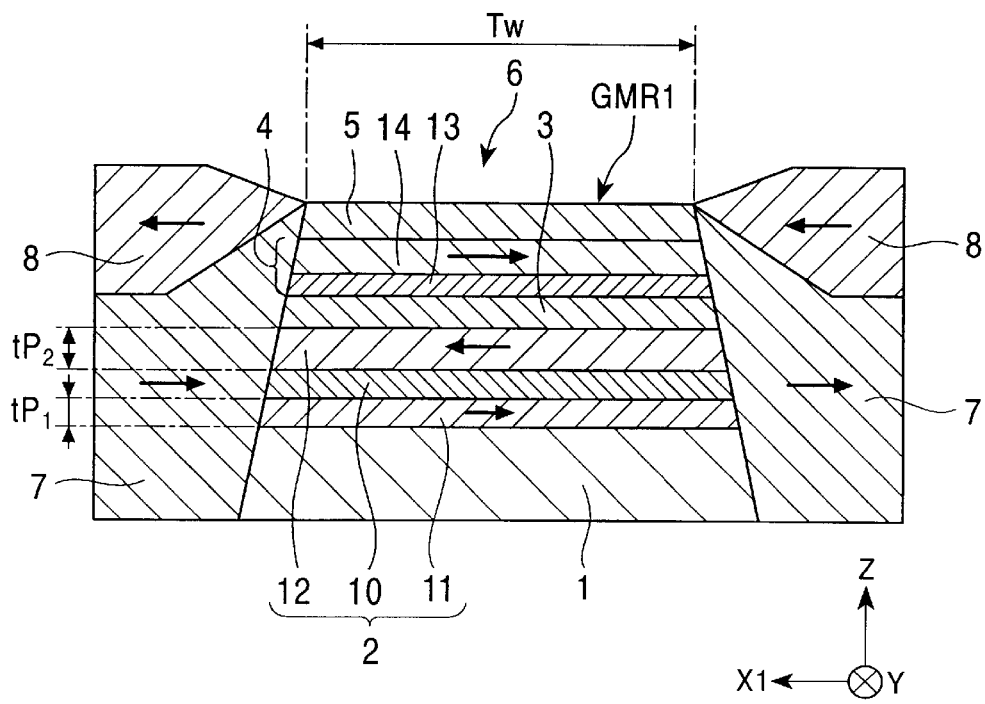
FIG. 2 is a cross-sectional view of the composite structure of the spin-valve magnetoresistive element shown in FIG. 1, when viewed from a face opposing a magnetic recording medium.

The spin-valve magnetoresistive element GMR1 will now be described in detail with reference to FIGS. 1, 2, 3A, and 3B. In FIGS. 1 and 2, the magnetic recording medium moves in the Z direction and the fringing magnetic field from the magnetic recording medium lies in the Y direction. The spin-valve magnetoresistive element GMR1 is formed on the lower gap layer 164.

An antiferromagnetic layer 1, a pinned magnetic layer 2, a nonmagnetic conductive layer 3, a free magnetic layer 4, and a protective layer 5 are formed, in that order, on the lower gap layer 164 to form a composite 6 having a trapezoidal cross-section. The upper face of the composite 6 is substantially equal to the track width Tw. Longitudinal biasing layers 7, composed of a hard magnetic material, are formed on both sloping sides of the composite 6 in the track width direction, and current leading layers 8 are formed on the longitudinal biasing layers 7. In this embodiment, the pinned magnetic layer 2 is divided into a first pinned magnetic layer 11 in contact with the antiferromagnetic layer 1 and a second pinned magnetic layer 12 in contact with the nonmagnetic conductive layer 3. The first pinned magnetic layer 11 and the second pinned magnetic layer 12 are separated by a nonmagnetic interlayer 10. Such a configuration is referred to as a synthetic ferri-pinned structure. In this embodiment, the free magnetic layer 4 is composed of a first free magnetic layer 13 in contact with the nonmagnetic conductive layer 3 and a second free magnetic layer 14 in contact with the protective layer 5.

Preferably, the antiferromagnetic layer 1 is composed of a PtMn alloy having an ordered structure or an XMn or PtMnX' alloy having an ordered structure. The PtMn alloy having an ordered structure exhibits higher corrosion resistance and has a higher blocking temperature and a higher exchange coupling magnetic field (exchange anisotropic magnetic field) than those of NiMn alloys and FeMn alloys which are conventionally used as antiferromagnetic layers. In the present invention, the PtMn alloy may be replaced with the XMn or XMnX' alloy wherein X is at least one element selected from the group consisting of Pd, Ir, Rh, and Ru, and X' is at least one element selected from the group consisting of Pd, Ir, Rh, Ru, Au, and Ag.

The first pinned magnetic layer 11 and the second pinned magnetic layer 12 are formed of, for example, a NiFe alloy, a CoNiFe alloy, or a CoFe alloy. The nonmagnetic interlayer 10 disposed between the first pinned magnetic layer 11 and the second pinned magnetic layer 12 is composed of at least one element selected from the group consisting of Ru, Rh, Ir, Cr, Re, and Cu.

The directions of the magnetic moments of the first pinned magnetic layer 11 and the second pinned magnetic layer 12 are represented by arrows in FIGS. 1, 2, 3A, and 3B, and the magnitude of the magnetic moment, that is, the magnetic thickness, is defined by being the product of the saturation magnetization (Ms) and the thickness (t).

The first pinned magnetic layer 11 and the second pinned magnetic layer 12 are composed of the same material, e.g., Co, and the thickness $tP_2$ of the second pinned magnetic layer 12 is larger than the thickness $tP_1$ of the first pinned magnetic layer 11. Thus, the magnetic moment or the magnetic thickness of the second pinned magnetic layer 12 is larger than the magnetic moment or the magnetic thickness of the first pinned magnetic layer 11. In the present invention, the thickness of the first pinned magnetic layer 11 and the thickness of the second pinned magnetic layer 12 must be different from each other. Thus, the thickness $tP_1$ of the first pinned magnetic layer 11 may be larger than the thickness $tP_2$ of the second pinned magnetic layer 12.

Under the above conditions, the thickness of the first pinned magnetic layer 11 is in a range of 1 to 7 nm, and the thickness of the second pinned magnetic layer 12 is in a range of 1 to 7 nm. Moreover, it is preferable that the difference in the thickness between these layers be in a range of 0.2 nm to 1.0 nm (10 Å). In addition, the thickness of the nonmagnetic interlayer 10 is in a range of 0.5 to 1 nm.

When the thickness of the first pinned magnetic layer 11 or the thickness of the second pinned magnetic layer 12 exceeds the above range, shunts of conduction electrons increase. Since the shunts do not contribute to the magnetoresistive effect, a rate of change in resistance is undesirably decreased. When the thickness is lower than the lower limit, the resistance of the element is significantly increased and the rate of change in resistance is significantly decreased. Arrows indicating the magnitudes of the magnetic moments in FIGS. 1 and 2 mean the components on the drawing. Thus, these arrows do not exactly express vectors of the magnetic moments. The vector and the direction of each magnetic moment will be described in detail with reference to FIGS. 3A and 3B below.

The free magnetic layer 4 shown in FIGS. 1 and 2 is composed of the first free magnetic layer 13 and the second free magnetic layer 14. The first free magnetic layer 13 in contact with the nonmagnetic conductive layer 3 is formed of a Co film, whereas the second free magnetic layer 14 is formed of a NiFe alloy, a CoFe alloy, or a CoNiFe alloy. The first free magnetic layer 13 composed of Co prevents diffusion of metallic elements at the interface with the nonmagnetic conductive layer 3 composed of Cu, and increases a rate of change in resistance ΔR/R.

In the mechanism for generating a giant magnetoresistive effect in which the nonmagnetic conductive layer 3 is disposed between the ferromagnetic pinned magnetic layer 2 and the free magnetic layer 4, spin-dependent scattering of conduction electrons is noticeable at the interface between the Co layer and the Cu layer. When the pinned magnetic layer 2 and the free magnetic layer 4 are formed of different materials, effects of the conduction electrons other than the spin-dependent scattering can be reduced. Accordingly, a higher magnetoresistive effect is achieved by the above combination. When the second pinned magnetic layer 12 is composed of Co, the first free magnetic layer 13 in contact with the nonmagnetic conductive layer 3 is preferably composed of a Co layer having a predetermined thickness. Instead of the Co layer in this embodiment, the free magnetic layer 4 may be composed of a single Co-alloy layer having a gradient Co content in which Co is enriched at a side in contact with the nonmagnetic conductive layer 3 and the Co content gradually decreases toward the protective layer 5.

The protective layer 5 is preferably composed of a metallic material, such as Ta, which is stable at high temperatures and exhibits high oxidation resistance.

The longitudinal biasing layers 7 shown in FIG. 2 are composed of a hard material such as a CoPt alloy or a CoCrPt alloy, and the current leading layers 8 are composed of a conductive material, such as Au, Ta, W, or Cr. The longitudinal biasing layers 7 applies a biasing magnetic field to the free magnetic layer 4 to align the magnetization of the free magnetic layer 4 in the direction of arrows shown in FIGS. 1, 2, 3A, and 3B in a single-domain state.

Figure 3A:
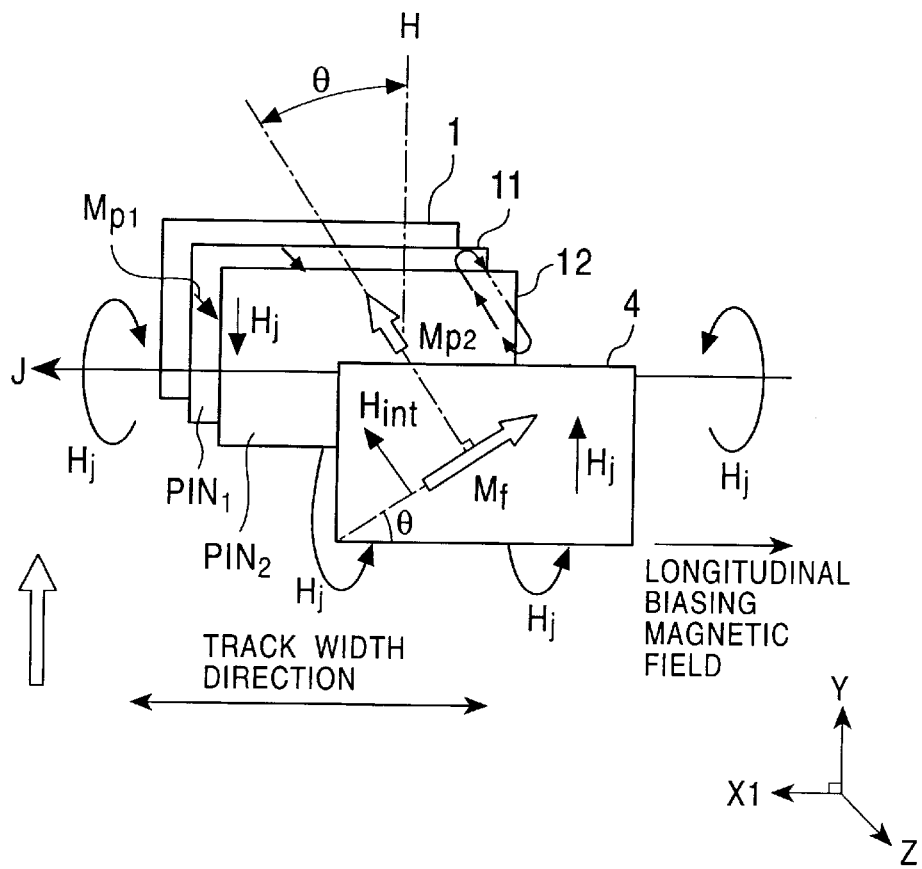
FIGS. 3A and 3B are schematic diagrams of magnetization vectors of a pinned magnetic layers and a free magnetic layer of a spin-valve magnetoresistive element in accordance with the present invention.
Figure 3B:
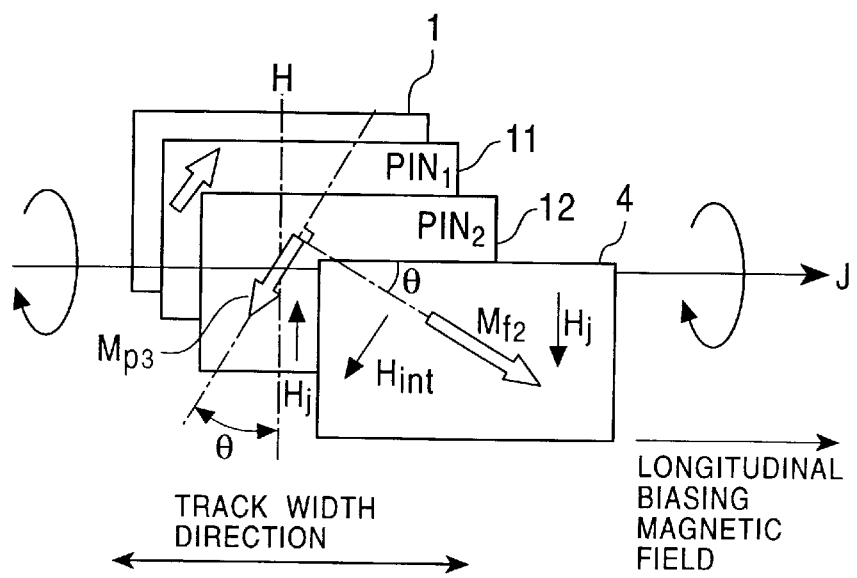

With reference to FIGS. 3A and 3B, the magnetization vector of the first pinned magnetic layer 11, the magnetization vector of the second pinned magnetic layer 12, and the direction of the detecting current magnetic field will now be described in detail.

As shown in FIGS. 3A and 3B, the magnetization vector of the first pinned magnetic layer 11 and the magnetization vector of the second pinned magnetic layer 12 are antiparallel to each other (ferrimagnetic state). Moreover, the magnetization vector of the free magnetic layer 4 when the detecting current J is applied is orthogonal to the magnetization vectors of the first and second pinned magnetic layer 11 and 12, respectively. In FIGS. 1 and 2, only vector components parallel to the drawings are shown; hence, these vector components are depicted, as if the arrows indicating the magnetization vectors of the first and pinned magnetic layers 11 and 12 are not orthogonal to the arrow indicating the magnetization vector of the free magnetic layer 4. In FIGS. 3A and 3B, however, the orthogonal relationship between these vectors is clear. The detecting current J flows from the right to the left in FIG. 3A, and flows from the left to the right in FIG. 3B. In both cases, the magnetization vectors of the first and second pinned magnetic layer 11 and 12, respectively, are substantially orthogonal to the magnetization vector of the free magnetic layer 4.

As shown in FIG. 3A, when the detecting current (sensing current) J is supplied from the current leading layers 8, the magnetization vector $M_f$ of the free magnetic layer 4 is aligned in a direction, which is orthogonal to the magnetization vector $M_{p2}$ of the second pinned magnetic layer 12, and the magnetization vector $M_{p2}$ of the second pinned magnetic layer 12 is tilted by an angle θ from the normal H of the track width direction toward a direction opposite to the longitudinal biasing magnetic field.

As shown in FIG. 3A, the magnetization vector $M_f$ of the free magnetic layer 4 points to the upper right when the magnetic field due to the detecting current J is applied, whereas the magnetization vector $M_f$ of the free magnetic layer 4 points to the longitudinal biasing magnetic field which is substantially parallel to the track width direction when the detecting current J does not flow. (Strictly speaking, the magnetization vector $H_f$ is not exactly parallel to the track width direction due to the demagnetizing field (dipole magnetic field) generated by the magnetic thickness of the first pinned magnetic layer 11 and the second pinned magnetic layer 12 and due to the interactive magnetic field $H_{int}$ between the second pinned magnetic layer 12 and the free magnetic layer 4.)

That is, the detecting current magnetic field $H_j$ generated by the detecting current J affects the magnetization of the nonmagnetic conductive layer 3 to tilt the magnetization vector of the free magnetic layer 4. The magnetization vector $M_f$ of the free magnetic layer 4 is set so that the magnetization vector $M_f$ is orthogonal to the magnetization vectors of the first and second pinned magnetic layer 11 and 12, respectively, when the detecting current magnetic field $H_j$ is applied.

In FIG. 3B, the detecting current flows from the left to the right. The magnetization vector of each layer is equivalent to that shown in FIG. 3A. That is, the magnetization vector of the free magnetic layer 4 is aligned in a direction, which is orthogonal to the magnetization vector of the second pinned magnetic layer 12, and the magnetization vector $M_{p3}$ of the second pinned magnetic layer 12 is tilted by an angle θ from the normal H of the track width direction toward a direction opposite to the longitudinal biasing magnetic field.

The tilt angle θ from the normal H of the magnetization vector $M_f$ (or $M_{f2}$) of the free magnetic layer 4 is in a range of preferably 2° to 30°, more preferably 3° to 15°, and most preferably 3° to 10°. A tilt angle θ exceeding 30° results in a decreased output of the magnetoresistive element, whereas a tilt angle θ less than 2° does not contribute to improvement in asymmetry.

In the above-described preferred range, the tilt angle θ is preferably determined so that the magnetization vector of the free magnetic layer 4 is aligned in a direction which is orthogonal to the magnetization vector of the second pinned magnetic layer 12 in response to the detecting current magnetic field $H_j$ when a desired detecting current J is applied. A magnetoresistive change is most effective when the magnetization vector of the free magnetic layer 4 rotates by an external magnetic field from the orthogonal arrangement to the magnetization vector of the second pinned magnetic layer 12 in a state in which no external magnetic field is applied. Since the detecting current J is determined to an appropriate level when the magnetic head is designed in view of the balance to the peripheral electrical circuits and the design manual, an optimized tilt angle is determined according to the detecting current J.

As described above, in the spin-valve magnetoresistive element GMR1 of the first embodiment, the magnetization vector of the free magnetic layer 4 is orthogonal to the magnetization vectors of the first and second pinned magnetic layer 11 and 12, respectively, when the detecting current magnetic field $H_j$ due to the detecting current J is applied, resulting in reduced asymmetry of the output.

Since the antiferromagnetic layer 1 is composed of the above-described PtMn, XMn or PtMnX' alloy, the antiferromagnetic layer 1 applies an intense exchange anisotropic magnetic field to the first pinned magnetic layer 11 so as to tightly pin the magnetization vector of the first pinned magnetic layer 11.

In the synthetic ferri-pinned structure of the first embodiment in which the first pinned magnetic layer 11 and the second pinned magnetic layer 12 are laminated with the nonmagnetic interlayer 10 provided therebetween, the antiferromagnetic layer 1 applies an exchange coupling magnetic field to the synthetic magnetic moment of the first and second pinned magnetic layer 11 and 12, respectively, so as to tightly pin the magnetization vector of the first pinned magnetic layer 11.

Moreover, the magnetization vector of the second pinned magnetic layer 12 having a larger magnetic moment is pinned by an exchange coupling magnetic field between the first pinned magnetic layer 11 and the second pinned magnetic layer 12 separated by the nonmagnetic interlayer 10 (by the RKKY interaction). Since the magnetization vector of the first pinned magnetic layer 11 and the magnetization vector of the second pinned magnetic layer 12 are antiparallel to each other, most of the magnetic moments of the first and second pinned magnetic layer 11 and 12, respectively, compensate for each other, and the residual magnetic field affects the external free magnetic layer 4 as the demagnetizing field (dipole magnetic field) $H_d$ from the first and second pinned magnetic layer 11 and 12, respectively. In the synthetic ferri-pinned structure, this demagnetizing field (dipole magnetic field) $H_d$ is smaller than that in a conventional single pinned magnetic layer configuration and causes imbalance between the demagnetizing field $H_d$ and the detecting current magnetic field $H_j$. However, the configuration of the first embodiment enables the orthogonal arrangement between the magnetization vector of the free magnetic layer 4 and the magnetization vectors of the first and second pinned magnetic layer 11 and 12, respectively, when the detecting current magnetic field $H_j$ is applied. Thus, this synthetic ferri-pinned structure can reduce asymmetry regardless of the above imbalance. When the magnetization vector of the free magnetic layer 4 rotates by the effect of the external magnetic field, the resistance exactly changes in response to the rotated angle and the output has reduced asymmetry.

A larger exchange coupling magnetic field from the antiferromagnetic layer 1 stabilizes the antiparallel arrangement of the magnetization of the first pinned magnetic layer 11 and the magnetization of the second pinned magnetic layer 12. The alloy used in this embodiment can generate an intense exchange coupling magnetic field from the antiferromagnetic layer 1 and has a blocking temperature which is higher than that of conventional alloys such as an FeMn alloy. Thus, the magnetization of the first pinned magnetic layer 11 and the magnetization of the second pinned magnetic layer 12 are thermally stable.

First Production Method

A first embodiment of a method for making the spin-valve magnetoresistive element shown in FIGS. 1, 2, 3A, and 3B will now be described.

In order to produce the spin-valve magnetoresistive element shown in FIGS. 1, 2, 3A, and 3B, the antiferromagnetic layer 1 composed of an antiferromagnetic material such as a PtMn, the first pinned magnetic layer 11, the nonmagnetic interlayer 10, the second pinned magnetic layer 12, the nonmagnetic conductive layer 3, the free magnetic layer 4 (including the first free magnetic layer 13 and the second free magnetic layer 14), and the protective layer 5 are deposited, in that order, on a substrate. FIG. 7A shows the layered structure of the main layers, that is, the antiferromagnetic layer 1, the first pinned magnetic layer 11, the second pinned magnetic layer 12, and the free magnetic layer 4, whereas other layers are omitted to simplify the drawing.

In this process, the first pinned magnetic layer 11 and the second pinned magnetic layer 12 may be deposited while a magnetic field is applied to a direction orthogonal to the track width direction. Preferably, the free magnetic layer 4 is deposited while a first magnetic field $H_1$ is applied in a first direction $D_1$ along the track width direction (or in a direction $D_{1A}$ opposite to the first direction $D_1$) to align the uniaxial anisotropy of the free magnetic layer 4 in the track width direction.

With reference to FIGS. 7B, in order to impart an ordered structure to the PtMn antiferromagnetic layer 1, the composite is subjected to a first annealing step (at 503 K to 553 K (230° C. to 280° C.) for 60 min to 480 min) while an intense second magnetic field $H_2$ of 400 kA/m or more is applied in a second direction $D_2$ which is tilted by a predetermined angle θ from a direction $D_A$ orthogonal to the track width direction. If a weak second magnetic field $H_2$ of 8 kA/m to 80 kA/m is applied, individual layers exhibit different magnetizations, and a third magnetic field $H_3$ may be required in a third direction $D_3$ opposite to the second direction $D_2$ in some cases. The case of the weak magnetic field will be described in detail later.

The antiferromagnetic material of the antiferromagnetic layer 1 is ordered by the first annealing step in the intense magnetic field of 400 kA/m or more. Thus, an intense exchange coupling magnetic field is applied to the first pinned magnetic layer 11 to align the magnetization vector of the first pinned magnetic layer 11 in the second direction $D_2$. After the applied magnetic field is removed, the exchange coupling magnetic field (the RKKY interaction) between the first pinned magnetic layer 11 and the second pinned magnetic layer 12 can pin the magnetization of the pinned magnetic layer 2 in the direction opposite to the magnetization vector of the first pinned magnetic layer 11. During the first annealing step, the directions of the uniaxially anisotropic easy axes of the free magnetic layer 4 are aligned in a direction parallel to the second direction $D_2$, which is tilted by a predetermined angle θ from the direction $D_A$ orthogonal to the track width direction, or the directions of the uniaxially anisotropic easy axes are dispersed.

With reference to FIG. 7C, the composite is subjected to a magnetic annealing step in which the composite is heated to 433 K to 513 K (160° C. to 240° C.) while a magnetic field $H_1$, which is weaker than the second magnetic field $H_2$ ($H_2 > H_1$), is applied in the direction $D_1$ parallel to the track width direction (or in the direction $D_{1A}$ opposite to the direction $D_1$) to align the directions of the uniaxially anisotropic easy axes of the free magnetic layer 4 in the direction $D_1$ (or the direction $D_{1A}$). This magnetic annealing step may be omitted.

After the longitudinal biasing layers 7 and the current leading layers 8, as shown in FIG. 2, are formed on both sides of the composite shown in FIG. 7C, the inductive head h2 shown in FIG. 5 is formed (FIG. 7D). In this step, the upper gap layer 166 and the upper shielding layer 167, which also functions as the lower core layer 167 for the inductive head, are formed on the composite. The gap layer 174 is formed thereon, and the induction coil 176 having the planar spiral pattern is formed on the gap layer 174 by a photolithographic process. The insulating layer 177 is formed so as to cover the induction coil 176. The composite is heated to 200° C. to 280° C. (473 K to 553 K) to cure the resin of the insulating layer 177. Next, the upper core layer 178 is formed and is processed to form the magnetic writing gap WG. Finally, the protective layer 179 is formed to complete the inductive head h2.

When the composite is heated to 200° C. (473 K) or more for curing of the insulating layer 177, the uniaxially anisotropic easy axes of the free magnetic layer 4, the lower shielding layer 163, and the lower core layer 167 are disordered as shown in FIG. 7E regardless of providing the lower shielding layer 163 and the lower core layer 167.

With reference to FIG. 7F, the composite is heated to 160° C. to 240° C. (433 K to 513 K) while a third magnetic field $H_3$ less than the second magnetic field $H_2$ is applied in the direction $D_1$ (or the $D_{1A}$) parallel to the track width direction to align the direction of the uniaxially anisotropic easy axes of the free magnetic layer 4, the lower shielding layer 163, the lower core layer 167 in the $D_1$ (or the $D_{1A}$) parallel to the track width direction. The intensity of the third magnetic field $H_3$ is preferably in a range of 8 kA/m to 40 kA/m so that the magnetization of each layer does not vary.

Next, a fourth magnetic field $H_4$ is applied to the longitudinal biasing layers 7 to magnetize the longitudinal biasing layers 7 in a fourth direction $D_4$ opposite to the direction $D_1$ or $D_{1A}$ of the third magnetic field, which caused the tilting of the magnetization vector of the second pinned magnetic layer from the direction orthogonal to the track width direction. In the magnetization step of the longitudinal biasing layers 7, the composite is placed in a magnetic generator, such as an electromagnet, and a magnetic field of 400 kA/m or more is applied in the uniaxially anisotropic direction of the free magnetic layer 4. The magnetized longitudinal biasing layers 7 align the magnetization vector of the free magnetic layer 4 substantially in the magnetization vector of the longitudinal biasing layers 7. The magnetization of the longitudinal biasing layers 7 is performed at room temperature, the anisotropy of the free magnetic layer and the pinned magnetic layers is not affected, since the applied magnetic field is magnetically large but is thermally small.

When a detecting current flows in the current leading layers 8 of the resulting spin-valve magnetoresistive element, a detecting current magnetic field $H_j$ changes the magnetization vector of the free magnetic layer 4 from the direction of the solid line to the direction of a dotted line (toward the right bottom) in FIG. 7G. As a result, the magnetization vectors of the first and second pinned magnetic layer 11 and 12, respectively, and the magnetization vector of the free magnetic layer 4 are orthogonal to each other.

When a fringing magnetic field from the magnetic recording medium is applied to the spin-valve magnetoresistive element, the magnetization vector of the free magnetic layer 4 rotates in response to the intensity of the fringing magnetic field, and the resistance of the element varies in response to the rotation. As a result, the fringing magnetic field from the magnetic recording medium is detected as a change in the detecting current in response to the change in the resistance.
Intensity of Magnetic Field during Second Annealing The relationship between the thicknesses of individual layers will now be described when the second annealing is performed in an intense magnetic field of 400 kA/m or more and in a weak magnetic field of approximately 8 kA/m to 80 kA/m in the first production method.

The first pinned magnetic layer 11 and the second pinned magnetic layer 12 have the following preferred relationship between the thicknesses thereof when the annealing is performed in an intense magnetic field of 400 kA/m or more and when the annealing is performed in a weak magnetic field.

In the synthetic ferri-pinned structure of the present invention having the first pinned magnetic layer 11 and the second pinned magnetic layer 12 separated by the nonmagnetic interlayer 10, the ratio of the thickness $tP_1$ of the first pinned magnetic layer to the thickness $tP_2$ of the second pinned magnetic layer is preferably in a range of 0.33 to 0.95 or 1.05 to 4 in order to obtain an intense exchange coupling magnetic field. The exchange coupling magnetic field, however, decreases with an increased thickness of the first pinned magnetic layer 11 or the second pinned magnetic layer 12 even when the ratio is within the above range. Thus, the thickness of the first pinned magnetic layer 11 and the thickness of the second pinned magnetic layer 12 are preferably optimized in the present invention.

For example, it is preferable that the thickness $tP_1$ of the first pinned magnetic layer 11 and the thickness $tP_2$ of the second pinned magnetic layer 12 be in a range of 10 to 70 Å and the difference between the thickness $tP_1$ and the thickness $tP_2$ be at least 2 Å. Herein, the overall exchange coupling magnetic field $H_{ex}$ indicates the intensity of the overall external magnetic field when the rate of change in resistance ΔR/R is half the maximum rate of change in resistance, and includes the exchange coupling magnetic field (exchange anisotropic magnetic field) generated between the antiferromagnetic layer 1 and the first pinned magnetic layer 11 and the exchange coupling magnetic field (the RKKY interaction) between the first pinned magnetic layer 11 and the second pinned magnetic layer 12.

Moreover, it is preferable that the ratio of the thickness $tP_1$ of the first pinned magnetic layer 11 to the thickness $tP_2$ of the second pinned magnetic layer 12 be in a range of 0.53 to 0.95 or 1.05 to 1.8. More preferably, the both thickness $tP_1$, and the thickness $tP_2$ are in a range of 10 to 50 Å and the difference between the thickness $tP_1$ and the thickness $tP_2$ is at least 2 Å, in addition to the above ratio. When the ratio of the thickness $tP_1$ to the thickness $tP_2$ are controlled within the above thickness range, the antiferromagnetic layer 1 composed of, for example, a PtMn alloy can readily generate an overall exchange coupling magnetic field $H_{ex}$ of at least 40 kA/m and a rate of change in resistance (ΔR/R) which is comparable to conventional levels.

A larger overall exchange coupling magnetic field can stabilize the antiparallel configuration between the magnetization of the first pinned magnetic layer 11 and the magnetization of the second pinned magnetic layer 12. In the present invention, the PtMn alloy, which has a high blocking temperature and generates an intense exchange coupling magnetic field at the interface with the first pinned magnetic layer 11, is used. Thus, magnetization of the first pinned magnetic layer 11 and magnetization of the second pinned magnetic layer 12 are thermally stable.

Experimental results show that when the first pinned magnetic layer 11 and the second pinned magnetic layer 12 are composed of the same material and have the same thickness, the overall exchange coupling magnetic field and the ΔR/R value are extremely decreased in a magnetic field of 8 to 80 kA/m during annealing. When the magnetic thickness $Ms \cdot tP_1$ of the first pinned magnetic layer 11 and the magnetic thickness $Ms \cdot tP_2$ of the second pinned magnetic layer 12 are the same, no antiparallel arrangement is generated between the magnetization of the first pinned magnetic layer 11 and the magnetization of the second pinned magnetic layer 12. By dispersion of these magnetization vectors, that is, magnetic moments in various directions, the relative angle to the magnetization of the free magnetic layer 4 cannot be appropriately controlled.

Such a problem is avoided by setting the magnetic thickness $Ms \cdot tP_1$ of the first pinned magnetic layer 11 and the magnetic thickness $Ms \cdot tP_2$ of the second pinned magnetic layer 12 to different levels. When the first pinned magnetic layer 11 and the second pinned magnetic layer 12 are formed of the same material, the thickness of the first pinned magnetic layer 11 and the thickness of the second pinned magnetic layer 12 must be different from each other.

In the present invention, as described above, the ratio of the thickness of the first pinned magnetic layer 11 to the thickness of the second pinned magnetic layer 12 is optimized. The ratio in a range of 0.95 to 1.05 is not included in the optimized range, because the thickness $tP_1$ of the first pinned magnetic layer 11 and the thickness $tP_2$ of the second pinned magnetic layer 12 are substantially the same in this range.

In the antiferromagnetic layer 1 composed of an antiferromagnetic material such as a PtMn alloy, which generates an exchange coupling magnetic field (exchange anisotropic magnetic field) at the interface to the first pinned magnetic layer 11 by annealing in a magnetic field, the magnetization of the first pinned magnetic layer 11 and the magnetization of the second pinned magnetic layer 12 are dispersed or are not aligned in proper directions regardless of different magnetic thicknesses of the first pinned magnetic layer 11 and the second pinned magnetic layer 12, when the direction and the intensity of the magnetic field applied during the annealing is not appropriately controlled.

TABLE 1

| | Ms · $tP_1$ of First Pinned Magnetic Layer > Ms · $tP_2$ of Second Pinned Magnetic Layer | | | |
|---|---|---|---|---|
| | (1) ← | (2) → | (3) → | (4) ← |
| Magnetization Vector during Annealing | 8 to 80 kA/m to the left | 8 to 80 kA/m to the right | 400 kA/m or more to the right | 400 kA/m or more to the left |
| First Pinned Magnetic Layer | ← | → | → | ← |
| Second Pinned Magnetic Layer | → | ← | → | ← |
| After removing Magnetic Field | ← | → | → | ← |

TABLE 2

Ms · tP$_1$ of First Pinned Magnetic Layer <
Ms · tP$_2$ of Second Pinned Magnetic Layer

| Magnetization Vector during Annealing | (1) ← 8 to 80 kA/m to the left | (2) → 8 to 80 kA/m to the right | (3) → 400 kA/m or more to the right | (4) ← 400 kA/m or more to the left |
|---|---|---|---|---|
| First Pinned Magnetic Layer | → | ← | → | ← |
| Second Pinned Magnetic Layer | ← | → | → | ← |
| After removing Magnetic Field | → | ← | → | ← |
|  | ← | → | → | ← |

Table 1 shows the magnetization vectors of the first pinned magnetic layer 11 and the magnetization vectors of the second pinned magnetic layer 12 during annealing in various magnetic fields and after removing the magnetic fields when the magnetic thickness Ms·tP$_1$ of the first pinned magnetic layer 11 is larger than the magnetic thickness Ms·tP$_2$ of the second pinned magnetic layer 12.

In case (1) in Table 1, 8 kA/m to 80 kA/m of magnetic field is applied toward the left (←) during the annealing. Since the magnetic thickness Ms·tP$_1$ of the first pinned magnetic layer 11 is larger than the magnetic thickness Ms·tP$_2$ of the second pinned magnetic layer 12, the dominant magnetization of the first pinned magnetic layer 11 is aligned to the left (←) along the applied magnetic field, whereas the magnetization of the second pinned magnetic layer 12 is aligned to be antiparallel (→) to the magnetization of the first pinned magnetic layer 11 by the exchange coupling magnetic field (RKKY interaction) between the first pinned magnetic layer 11 and the second pinned magnetic layer 12.

In case (2) in Table 1, 8 kA/m to 80 kA/m of magnetic field is applied toward the right (→) during the annealing. The dominant magnetization of the first pinned magnetic layer 11 is aligned to the right (→) along the applied magnetic field, whereas the magnetization of the second pinned magnetic layer 12 is aligned to be antiparallel (←) to the magnetization of the first pinned magnetic layer 11.

In case (3) in Table 1, 400 kA/m or more of magnetic field is applied toward the right (→) during the annealing. The dominant magnetization of the first pinned magnetic layer 11 is aligned to the right (→) along the applied magnetic field. The exchange coupling magnetic field (the RKKY interaction) generated between the first pinned magnetic layer 11 and the second pinned magnetic layer 12 is approximately 80 kA/m to 400 kA/m. When a magnetic field of 400 kA/m or more is applied, the magnetization of the second pinned magnetic layer 12 is also aligned in the direction this magnetic field, that is, to the right (→). In case (4) in Table 1, 400 kA/m or more of magnetic field is applied toward the left (←) during the annealing. Both the magnetization of the first pinned magnetic layer 11 and the magnetization of the second pinned magnetic layer 12 are aligned to the left direction (←).

In cases (3) and (4) in Table 1, the applied magnetic field is removed, the magnetization vector of the second pinned magnetic layer 12 is reversed by the exchange coupling magnetic field (the RKKY interaction) generated between the first pinned magnetic layer 11 and the second pinned magnetic layer 12. Thus, the magnetization vector of the first pinned magnetic layer 11 and the magnetization vector of the second pinned magnetic layer 12 are antiparallel to each other.

Table 2 shows the magnetization vectors of the first pinned magnetic layer 11 and the magnetization vectors of the second pinned magnetic layer 12 during annealing in various magnetic fields and after removing the magnetic fields when the magnetic thickness Ms·tP$_1$ of the first pinned magnetic layer 11 is smaller than the magnetic thickness Ms·tP$_2$ of the second pinned magnetic layer 12.

In case (1) in Table 2, 8 kA/m to 80 kA/m of magnetic field is applied toward the left (←) during the annealing. Since the magnetic thickness Ms·tP$_2$ of the second pinned magnetic layer 12 is larger than the magnetic thickness Ms·tP$_1$ of the first pinned magnetic layer 11, the dominant magnetization of the second pinned magnetic layer 12 is aligned to the left (←) along the applied magnetic field. The magnetization of the first pinned magnetic layer 11 is aligned to be antiparallel (→) to the magnetization of the first second pinned magnetic layer 12 by the exchange coupling magnetic field (RKKY interaction) between the first pinned magnetic layer 11 and the second pinned magnetic layer 12. In case (2) in Table 2, 8 kA/m to 80 kA/m of magnetic field is applied toward the right (→) during the annealing. The dominant magnetization of the second pinned magnetic layer 12 is aligned to the right (→) along the applied magnetic field, whereas the magnetization of the first pinned magnetic layer 11 is aligned to be antiparallel (←) to the magnetization of the second pinned magnetic layer 12.

In case (3) in Table 2, 400 kA/m or more of magnetic field is applied toward the right (→) during the annealing. Since the applied magnetic field is larger than the exchange coupling magnetic field (RKKY interaction) between the first pinned magnetic layer 11 and the second pinned magnetic layer 12, both the magnetization of the first pinned magnetic layer 11 and the magnetization of the second pinned magnetic layer 12 are aligned to the right (→) along the applied magnetic field. In case (4) in Table 2, 400 kA/m or more of magnetic field is applied toward the left (←) during the annealing. Both the magnetization of the first pinned magnetic layer 11 and the magnetization of the second pinned magnetic layer 12 are aligned to the left direction (←).

In cases (3) and (4) in Table 2, when the applied magnetic field is removed, the magnetization vector of the first pinned magnetic layer 11 is reversed by the exchange coupling magnetic field (the RKKY interaction) generated between the first pinned magnetic layer 11 and the second pinned magnetic layer 12. Thus, the magnetization vector of the first pinned magnetic layer 11 and the magnetization vector of the second pinned magnetic layer 12 are antiparallel to each other.

For example, when the magnetization of the first pinned magnetic layer 11 is aligned to the right (→), the appropriate direction and intensity of the magnetic field during the annealing are as follows:

Cases (2) and (3) in Table 1 (long arrows in the light direction in column "After removing Magnetic Field") when the magnetic thickness of the first pinned magnetic layer 11 is larger than the magnetic thickness of the second pinned magnetic layer 12, and Cases (1) and (3) in Table 2 (short arrows in the light direction in column "After removing Magnetic Field") when the magnetic thickness of the second pinned magnetic layer 12 is larger than the magnetic thickness of the first pinned magnetic layer 11.

In Cases (2) and (3) in Table 1, the magnetization of the first pinned magnetic layer 11 having a larger magnetic thickness Ms·tP$_1$ is aligned to the right by the effect of the applied magnetic field toward the light during the annealing, and the magnetization of the first pinned magnetic layer 11 is pinned to the right by the exchange coupling magnetic field (exchange anisotropic magnetic field) at the interface between the first pinned magnetic layer 11 and the antiferromagnetic layer 1 during the annealing. In Case (3) in Table 1, after the magnetic field of 400 kA/m or more is removed, the magnetization of the second pinned magnetic layer 12 is reversed toward the left (←) by the exchange coupling magnetic field (RKKY interaction) between the first pinned magnetic layer 11 and the second pinned magnetic layer 12.

In cases of (1) and (3) in Table 2, the magnetization to the right of the first pinned magnetic layer 11 is pinned to the right by the exchange coupling magnetic field (exchange anisotropic magnetic field) at the interface between the antiferromagnetic layer 1 and the first pinned magnetic layer 11. In case (3) in Table 2, after the magnetic field of 400 kA/m or more is removed, the magnetization of the second pinned magnetic layer 12 is reversed toward the left (←) by the exchange coupling magnetic field (RKKY interaction) between the first pinned magnetic layer 11 and the second pinned magnetic layer 12.

When 8 kV/m to 80 kV/m of magnetic field is applied in a case that the magnetic thickness of the first pinned magnetic layer 11 is larger than the magnetic thickness of the second pinned magnetic layer 12 (corresponding to case (1) or (2) in Table 2), the magnetization vector of the first pinned magnetic layer 11 is opposite to the vector of the applied magnetic field. After the applied magnetic field is removed, the magnetization vector of the first pinned magnetic layer 11 is still opposite to the vector of the applied magnetic field.

As described above with reference to Tables 1 and 2, the thickness of the first pinned magnetic layer 11, the thickness of the second pinned magnetic layer 12. When the magnetic thickness of the second pinned magnetic layer 12 is larger than the magnetic thickness of the first pinned magnetic layer 11 in the configuration shown in FIGS. 1, 2, 3A, and 3B, and the application of 400 kA/m or more of second magnetic field $H_2$ corresponds Case (3) or (4) in Table 2. That is, in the above-described method, when 400 kA/m or more of second magnetic field $H_2$ is applied in the second direction $D_2$, both the magnetization vector of the first pinned magnetic layer 11 and the magnetization vector of the second pinned magnetic layer 12 are aligned in the second direction $D_2$. After the second magnetic field $H_2$ is removed, the magnetization vector of the second pinned magnetic layer 12 is aligned in the direction $D_3$ opposite to the second direction $D_2$ by the exchange coupling magnetic field (RKKY interaction) between the first pinned magnetic layer 11 and the second pinned magnetic layer 12. As a result, individual layers have magnetization vectors shown in FIG. 7B. When the intensity of the applied magnetic field is in a range of 8 kA/m to 80 kA/m in the above method, the magnetic field is applied in the direction $D_3$ opposite to the second direction $D_2$, as in Cases (1) and (2) in Table 2.

When the magnetic thickness of the first pinned magnetic layer 11 is larger than the magnetic field of the second pinned magnetic layer 12, the relationship between the magnetization vector and the applied magnetic field is shown in Table 1. Thus, 400 kA/m or more of magnetic field or 8 kA/m to 80 kA/m of magnetic field is applied in the second direction $D_2$ to align the magnetization vector of the first pinned magnetic layer 11 in the second direction $D_2$.

As shown in Tables 1 and 2, the intensity of the magnetic field applied during the annealing is in a range of 8 kA/m to 80 kA/m or in a range of 400 kA/m or more, and the range between 80 kA/m and 400 kA/m is not included in the preferable ranges for the following reasons.

The magnetization of a pinned magnetic layer having a larger magnetic thickness Ms·tP is aligned in the direction of the applied magnetic field. When the applied magnetic field is in a range of 80 kA/m to 400 kA/m, the magnetization of another pinned magnetic layer having a smaller magnetic thickness is also aligned by significant effects of the applied magnetic field. Thus, an antiparallel configuration is not achieved between these two pinned magnetic layers, and magnetizations of these pinned magnetic layers are oriented in various directions, resulting in magnetization dispersion. Thus, the magnetic field in a range of 80 kA/m to 400 kA/m is excluded from the preferable range in the present invention. Alignment of the magnetization vector of the pinned magnetic layer having a larger thickness tP requires a magnetic field of at least 8 kA/m.

The above-described intensity of the magnetic field during the annealing and the control of the direction are applicable to any antiferromagnetic material which requires annealing, for example, are applicable to a conventional NiMn alloy which is used as the antiferromagnetic layer 1.

In the above method in accordance with the present invention, by the preferable ratio of the thickness of the first pinned magnetic layer 11 to the thickness of the second pinned magnetic layer 12, the overall exchange coupling magnetic field $H_{ex}$ is increased, a thermally stable antiparallel arrangement is achieved between the magnetization of the first pinned magnetic layer 11 and the magnetization of the second pinned magnetic layer 12, and the rate of change in resistance $\Delta R/R$ is comparable to that of conventional elements.

Appropriate control of the intensity and the direction of the magnetic field during the annealing can determine the magnetization vector of the first pinned magnetic layer 11 and the magnetization vector of the second pinned magnetic layer 12 in desired directions.

As described above, the magnetic moment (magnetic thickness) is defined by being the product of the saturation magnetization Ms and the thickness t. For example, the saturation magnetization Ms is approximately 1.0 T (tesla) for bulk solid NiFe or approximately 1.7 T for bulk solid Co. Thus, the magnetic thickness of a NiFe film having a thickness of 30 Å is 30 Å·T. The magnetostatic energy of the ferromagnetic film when an external magnetic field is applied is proportional to the product of the magnetic thickness and the external magnetic field. When a ferromagnetic film having a larger magnetic thickness and a ferromagnetic film having a smaller magnetic thickness are in a ferrimagnetic state by the RKKY interaction via a nonmagnetic interlayer, the ferromagnetic film having the larger magnetic thickness is readily aligned in the direction of the external magnetic field.

When a ferromagnetic film is in contact with a nonmagnetic film composed of tantalum (Ta), ruthenium (Ru) or copper (Cu) or is in contact with an antiferromagnetic layer such as a PtMn film, atoms in the nonmagnetic layer and the antiferromagnetic layer are in direct contact with atoms (Ni, Fe, or Co) in the ferromagnetic film. Thus, it is known that the saturation magnetization Ms of the ferromagnetic film at the interface with the nonmagnetic film or the antiferromagnetic layer is smaller than the saturation magnetization Ms of the corresponding bulk solid. When the composite of the ferromagnetic film, the nonmagnetic film, and the antiferromagnetic layer are annealed, interfacial diffusion proceeds during the annealing to generate a distribution of the saturation magnetization Ms in the thickness direction of the ferromagnetic film. That is, the saturation magnetization Ms of the ferromagnetic film is small near the nonmagnetic film and the antiferromagnetic layer and draws to the saturation magnetization Ms of the corresponding bulk solid.

The decrease in the saturation magnetization Ms of the ferromagnetic film near the nonmagnetic film and the antiferromagnetic layer depends on the materials for the antiferromagnetic layer and the ferromagnetic film, the order of deposition of the layers, and the annealing temperature. The magnetic thickness in the present invention is determined in view of the decrease in saturation magnetization Ms due to thermal diffusion with the nonmagnetic film and the antiferromagnetic layer.

The formation of diffusion layer at the interface between the PtMn film and the ferromagnetic film is required for achieving an exchange coupling magnetic field at the interface therebetween. The decrease in the saturation magnetization Ms of the ferromagnetic film due to the formation of the diffusion layer depends on the order of the deposition of the PtMn film and the ferromagnetic film.

In the bottom-type spin-valve magnetoresistive element in which the antiferromagnetic layer 1 is formed below the free magnetic layer 4, a shown in FIG. 1, a thermal diffusion layer is readily generated at an interface between the antiferromagnetic layer 1 and the free magnetic layer 4. Thus, the actual magnetic thickness of the first pinned magnetic layer 11 is smaller than the calculated thickness $tP_1$. When the magnetic thickness of the first pinned magnetic layer 11 excessively decreases, the difference in the thickness between the first pinned magnetic layer 11 and the second pinned magnetic layer 12 becomes excessively large. Thus, thickening of the thermal diffusion layer relative to the first pinned magnetic layer 11 results in a decreased exchange coupling magnetic field.

In the present invention, in order to achieve a ferrimagnetic state of the magnetizations of the first pinned magnetic layer 11 and the second pinned magnetic layer 12 using the antiferromagnetic layer 1, which requires annealing for generating an exchange coupling magnetic field at the interface with the first pinned magnetic layer 11, the magnetic thickness of the first pinned magnetic layer 11 and the magnetic thickness of the second pinned magnetic layer 12 must be optimized in addition to the optimization of the thicknesses of the first pinned magnetic layer 11 and the second pinned magnetic layer 12.

Achieving the ferrimagnetic state requires some differences in the thickness between the first pinned magnetic layer 11 and the second pinned magnetic layer 12. An excessively large difference in the thickness between the first pinned magnetic layer 11 and the second pinned magnetic layer 12 results in an undesirable decrease in the exchange coupling magnetic field. It is preferable in the present invention that the ratio of the magnetic thickness of the first pinned magnetic layer 11 to the magnetic thickness of the second pinned magnetic layer 12 be in a range of 0.33 to 0.95 or in a range of 1.05 to 4, as in the ratio of the thickness of the first pinned magnetic layer 11 to the thickness of the second pinned magnetic layer 12. Moreover, both the magnetic thickness of the first pinned magnetic layer 11 and the magnetic thickness of the second pinned magnetic layer 12 are preferably in a range of 10 Å·T to 70 Å·T, and the difference in the thickness therebetween is preferably at least 2 Å·T.

Also, the ratio of the magnetic thickness of the first pinned magnetic layer 11 to the magnetic field of the second pinned magnetic layer 12 is preferably in a range of 0.53 to 0.95 or in a range of 1.05 to 1.8. Moreover, it is preferable that both the magnetic thickness of the first pinned magnetic layer 11 and the magnetic thickness of the second pinned magnetic layer 12 be in a range of 10 to 50 Å·T and the difference in the magnetic thickness between the first pinned magnetic layer 11 and the second pinned magnetic layer 12 be in a range of 2 Å·T or more, in addition to the above range.

Second Production Method

With reference to FIGS. 8A to 8G, a second method for making the spin-valve magnetoresistive element in accordance with the first embodiment shown in FIGS. 1, 2, 3A, and 4A will now be described.

In this method, the antiferromagnetic layer 1 composed of PtMn, the first pinned magnetic layer 11, the nonmagnetic interlayer 10, the second pinned magnetic layer 12, the nonmagnetic conductive layer 3, the free magnetic layer 4 (composed of the first free magnetic layer 13 and the second free magnetic layer 14), and the protective layer 5 are deposited in that order on a substrate. FIG. 8A shows the layered structure of the main layers, that is, the antiferromagnetic layer 1, the first pinned magnetic layer 11, the second pinned magnetic layer 12, and the free magnetic layer 4, whereas other layers are omitted to simplify the drawing.

In this process, the first pinned magnetic layer 11 and the second pinned magnetic layer 12 may be deposited while a magnetic field is applied to a direction orthogonal to the track width direction. Preferably, the free magnetic layer 4 is deposited while a first magnetic field $H_1$ is applied in a first direction $D_1$ along the track width direction (or in a direction $D_{1A}$ opposite to the first direction $D_1$) to align the uniaxial anisotropy of the free magnetic layer 4 in the track width direction.

With reference to FIG. 8B, in order to impart an ordered structure to the PtMn antiferromagnetic layer 1, the composite is subjected to a first annealing step (at 503 K to 553 K (230° C. to 280° C.) for 60 min to 480 min) while an intense second magnetic field $H_{12}$ of 400 kA/m or more is applied in a second direction $D_A$ which is orthogonal to the track width direction. When a weak second magnetic field $H_{12}$ of 8 kA/m to 80 kA/m is applied and when the magnetic thickness of the second pinned magnetic layer is larger than the magnetic thickness of the first pinned magnetic layer, individual layers exhibit different magnetizations, and the second magnetic field $H_{12}$ must be applied in a third direction $D_B$ opposite to the second direction $D_A$.

The magnetization vector of the second magnetic field for magnetizing the first pinned magnetic layer 11 and the second pinned magnetic layer 12 is determined according to the magnetic thickness of the first pinned magnetic layer 11 and the magnetic thickness of the second pinned magnetic layer 12, as in FIG. 7 with reference to Tables 1 and 2.

For example, when the magnetic thickness of the first pinned magnetic layer 11 is larger as shown in Table 1, the magnetization of the first pinned magnetic layer 11 is aligned in the direction of an applied magnetic field of 8 kA/m to 80 kA/m or in an applied magnetic field of 400 kA/m or more, whereas the magnetization of the second pinned magnetic layer 12 is aligned in the direction opposite to the applied magnetic field.

When the magnetic thickness of the second pinned magnetic layer 12 is larger as shown in Table 2 and when a magnetic field of 8 kA/m to 80 kA/m is applied, the magnetization of the first pinned magnetic layer 11 is aligned in the direction opposite to the applied magnetic field, whereas the magnetization of the second pinned magnetic layer 12 is aligned in the direction of the applied magnetic field. When the magnetic thickness of the second pinned magnetic layer 12 is larger as shown in Table 2 and when a magnetic field of 400 kA/m or more is applied, the magnetization of the first pinned magnetic layer 11 is aligned in the direction of the applied magnetic field, whereas the magnetization of the second pinned magnetic layer 12 is aligned in the direction opposite to the applied magnetic field.

An intense exchange coupling magnetic field due to the ordered antiferromagnetic layer 1, which is formed during the first annealing, is applied to the first pinned magnetic layer 11. Thus, the magnetization vector of the first pinned magnetic layer 11 is tilted toward the direction $D_A$ of the second magnetic field $H_{12}$. Moreover, the magnetization vector of the second pinned magnetic layer 12 is pinned in a third direction $D_B$ opposite to the magnetization vector of the first pinned magnetic layer 11 due to an exchange coupling magnetic field (RKKY interaction) generated between the first pinned magnetic layer 11 and the second pinned magnetic layer 12. In addition, when the magnetic field $H_{12}$ is applied in the second direction $D_A$, the directions of the uniaxially anisotropic easy axes of the free magnetic layer 4 are aligned in a direction which is parallel to the second direction $D_A$ or third direction $D_B$ which is orthogonal to the track width direction, or the directions of the uniaxially anisotropic easy axes are dispersed.

With reference to FIG. 8C, the composite is subjected to a magnetic annealing step in which the composite is heated to 433 K to 513 K (160° C. to 240° C.) while a magnetic field $H_{22}$, which is weaker than the second magnetic field $H_{12}$, is applied in the direction $D_1$ parallel to the track width direction (or in the direction $D_{1A}$ opposite to the $D_1$) to align the directions of the uniaxially anisotropic easy axes of the free magnetic layer 4 in the direction $D_1$ (or in the direction $D_{1A}$ opposite to the $D_1$) parallel to the track width direction. This magnetic annealing step may be omitted.

After the longitudinal biasing layers 7 and the current leading layers 8, as shown in FIG. 2, are formed on both sides of the composite shown in FIG. 8C, the inductive head h2 shown in FIG. 5 is formed (FIG. 8D). In this step, the upper gap layer 166 and the upper shielding layer 167, which also functions as the lower core layer 167 for the inductive head, are formed on the composite. The gap layer 174 is formed thereon, and the induction coil 176 having the planar spiral pattern is formed on the gap layer 174 by a photolithographic process. The insulating layer 177 is formed so as to cover the induction coil 176. The composite is heated to 200° C. to 280° C. (473 K to 553 K) to cure the resin of the insulating layer 177. Next, the upper core layer 178 is formed and is processed to form the magnetic writing gap WG. Finally, the protective layer 179 is formed to complete the inductive head h2.

When the composite is heated to 200° C. (473 K) or more for curing the insulating layer 177, the uniaxially anisotropic easy axes of the free magnetic layer 4, the lower shielding layer 163, and the lower core layer 167 are disordered as shown in FIG. 8E regardless of providing the lower shielding layer 163 and the lower core layer 167.

With reference to FIG. 8F, the composite is heated to 160° C. to 240° C. (433 K to 513 K) while a third magnetic field $H_{13}$ of 400 kA/m or less is applied in the direction $D_{1A}$ parallel to the track width direction to align the magnetization vectors of the first pinned magnetic layer 11 and the second pinned magnetic layer 12 in a fourth direction $D_{14}$ which is tilted by an angle θ from the second direction $D_A$ orthogonal to the track width direction, and to align the direction of the uniaxially anisotropic easy axes of the free magnetic layer 4, the lower shielding layer 163, and the upper shield layer 167 in the direction $D_{1A}$ parallel to the track width direction. The tilt angle θ can be controlled by the intensity of the third magnetic field $H_{13}$. When this magnetic field is excessively large, the composite ferri-pinned structure is not maintained. Thus, the intensity of this magnetic field is preferably less than the exchange coupling magnetic field of the composite ferri-pinned structure. Alternatively, the tilt angle θ can be determined by controlling the intensity of the third magnetic field $H_{13}$ and the third annealing temperature $T_{13}$.

Next, a fourth magnetic field $H_{14}$ is applied to the longitudinal biasing layers 7 to magnetize the longitudinal biasing layers 7 in a fifth direction $D_{15}$ opposite to the direction $D_{1A}$ of the third magnetic field, which caused the tilting of the magnetization vector of the second pinned magnetic layer 12. In the magnetization step of the longitudinal biasing layers 7, the composite is placed in a magnetic generator, such as an electromagnet, and a magnetic field of 400 kA/m or more is applied in the uniaxially anisotropic direction of the free magnetic layer 4. The magnetized longitudinal biasing layers 7 align the magnetization vector of the free magnetic layer 4 substantially in the magnetization vector of the longitudinal biasing layers 7.

When a detecting current flows in the current leading layers 8 of the resulting spin-valve magnetoresistive element, a detecting current magnetic field $H_j$ tilts the magnetization vector of the free magnetic layer 4 to the right bottom in FIG. 8G. As a result, the magnetization vectors of the first and second pinned magnetic layer 11 and 12, respectively, and the magnetization vector of the free magnetic layer 4, are orthogonal to each other.

When a fringing magnetic field from the magnetic recording medium is applied to the spin-valve magnetoresistive element, the magnetization vector of the free magnetic layer 4 rotates in response to the intensity of the fringing magnetic field, and the resistance of the element varies in response to the rotation. As a result, the fringing magnetic field from the magnetic recording medium is detected as a change in the detecting current in response to the change in the resistance.

In the above-described method, the magnetic thickness of the second pinned magnetic layer 12 is larger than the magnetic thickness of the first pinned magnetic layer 11. A method for applying a third magnetic field $H_{13}$ of approximately 240 kA/m to 400 kA/m, when the magnetic thickness of the first pinned magnetic layer 11 is larger than the magnetic thickness of the second pinned magnetic layer 12, will now be described.

The relationships between the magnetic thicknesses of the first and second pinned magnetic layer 11 and 12, respectively, and the intensity and the vector of the applied magnetic field are similar to those in the first production method with reference to Tables 1 and 2.

In the second production method, however, exchange anisotropy between the first pinned magnetic layer 11 and the antiferromagnetic layer 1 occurs. Thus, the magnetization vectors of the first and second pinned magnetic layer 11 and 12, respectively, cannot be completely aligned in the direction of arrows shown in Tables 1 and 2 and are tilted in the direction of the exchange anisotropy, even when the magnetic fields shown in Tables 1 and 2 are applied.

Moreover, the lower and upper shielding layers 163 and 167 provided under/on the composite absorb parts of the applied magnetic field. Thus, the effective magnetic field affecting the first pinned magnetic layer 11 and the free magnetic layer 4 is approximately half or less of the applied magnetic field.

Thus, in the third production method, a weak third magnetic field $H_{13}$ of 8 kA/m to 80 kA/m or 240 kA/m to 400 kA/m is applied in the third direction $D_1$ opposite to the direction $D_{1A}$ which is parallel to the track width direction.

When the third magnetic field $H_{13}$ is larger than 400 kA/m, the third magnetic field $H_{13}$ is also applied in the third direction $D_1$. However, the magnetization vector is not exactly controlled so as to have the tilt angle θ in such an intense third magnetic field $H_{13}$ exceeding 400 kA/m. Accordingly, the applied magnetic field is preferably in a range of 8 kA/m to 80 kA/m or 240 kA/m to 400 kA/m.

Second Embodiment

FIG. 9 is a schematic cross-sectional view of a second embodiment of a spin-valve magnetoresistive element of the present invention, and FIG. 10 is a cross-sectional view of the spin-valve magnetoresistive element shown in FIG. 9 when viewed from a face opposing a magnetic recording medium. This spin-valve magnetoresistive element is also provided in a floating thin-film magnetic head which is installed in a magnetic recording unit, such as a hard disk, to detect a recorded magnetic field from the magnetic recording medium.

In the spin-valve magnetoresistive element GMR2, the free magnetic layer is divided into a first free magnetic layer and a second free magnetic layer separated by a nonmagnetic interlayer provided therebetween, as in the first and second pinned magnetic layer 11 and 12, respectively.

In FIGS. 9 and 10, components having the same functions as in FIGS. 1, 2, 3A, and 3B are referred to with the same numerals, and a detailed description thereof with reference to the drawings has been omitted.

As in the first embodiment, the first pinned magnetic layer 11, the nonmagnetic interlayer 10, the second pinned magnetic layer 12, and the nonmagnetic conductive layer 3 are deposited on the antiferromagnetic layer 1 in the second embodiment. Moreover, a first free magnetic layer 20, a nonmagnetic interlayer 21, a second free magnetic layer 22, and the protective layer 5 are deposited in that order to form a composite S2. Each layer may be composed of the material referred to in the first embodiment.

That is, the first pinned magnetic layer 11 and the second pinned magnetic layer 12 are composed of metallic cobalt, a NiFe alloy, a CoFe alloy, or a CoNiFe alloy. The nonmagnetic interlayer 10 is preferably composed of at least one element selected from the group consisting of Ru, Rh, Ir, Cr, Re, and Cu. The nonmagnetic conductive layer 3 is composed of Cu, Cr, or the like.

The nonmagnetic interlayer 21 is preferably composed of at least one element selected from the group consisting of Ru, Rh, Ir, Cr, Re, and Cu.

The magnetization vector of the first pinned magnetic layer 11 and the magnetization vector of the second pinned magnetic layer 12 are antiparallel to each other and are in a ferrimagnetic state, as described in the first embodiment.

The first free magnetic layer 20 is formed on the nonmagnetic conductive layer 3. As shown in FIGS. 9 and 10, the first free magnetic layer 20 has a double-layer configuration including a first free layer 27 and a second free layer 28. The first free layer 27 is composed of Co and is in contact with the nonmagnetic conductive layer 3. The Co first free layer 27 increases the ΔR/R value and prevents diffusion between the nonmagnetic conductive layer 3 and the second free layer 28.

The second free layer 28 is composed of a NiFe alloy and is formed on the first free layer 27. The nonmagnetic interlayer 21 is formed on the second free layer 28. The second free magnetic layer 22 is formed on the nonmagnetic interlayer 21 and the protective layer 5 is formed on the second free magnetic layer 22. The second free magnetic layer 22 is formed of cobalt, a NiFe alloy, a CoFe alloy, or a CoNiFe alloy.

With reference to FIG. 10, the composite S2 has a trapezoidal cross-section. Longitudinal biasing layers 7 and current leading layers 8 are formed on both sloping sides of the composite S2, as in the first embodiment. A longitudinal biasing magnetic field from the longitudinal biasing layers 7, which are magnetized in the direction opposite to the X1 direction, is applied to the first free magnetic layer 20 so that the first free magnetic layer 20 is magnetized in the direction opposite to the X1 direction when no detecting current is applied.

The first free magnetic layer 20 and the second free magnetic layer 22 are separated by the nonmagnetic interlayer 21, and the magnetization vector of the first free magnetic layer 20 and the magnetization vector of the second free magnetic layer 22 are antiparallel to each other (in a ferrimagnetic state) by the exchange coupling magnetic field (RKKY interaction) which is generated between the first free magnetic layer 20 and the second free magnetic layer 22.

In the spin-valve magnetoresistive element shown in FIGS. 9 and 10, for example, the thickness $tF_1$ of the first free magnetic layer 20 is smaller than the thickness $tF_2$ of the second free magnetic layer 22. Moreover, the magnetic thickness $(Ms \cdot tF_1)$ of the first free magnetic layer 20 is smaller than the magnetic thickness $(Ms \cdot tF_2)$ of the second free magnetic layer 22. When no detecting current magnetic field is applied, the magnetization vector of the second free magnetic layer 22 having a larger magnetic thickness $(Ms \cdot tF_2)$ is aligned in the direction opposite to the X1 direction by the effect of the biasing magnetic field from the longitudinal biasing layers 7, whereas the magnetization vector of the first free magnetic layer 20 having a smaller magnetic field $(Ms \cdot tF_1)$ is aligned substantially in the X1 direction by an exchange coupling magnetic field with the second free magnetic layer 22 (RKKY interaction).

When the detecting current magnetic field $H_j$ is applied in this embodiment, the magnetization vectors of the first and second free magnetic layers 20 and 22, respectively, and the magnetization vectors of the first and second pinned magnetic layer 11 and 12, respectively, have substantially the same angular relationship, as in the embodiment shown in FIGS. 3A and 3B. In this embodiment, however, the magnetization vector of the second free magnetic layer 22 having a larger thickness is aligned in the magnetization vector $M_f$ of the free magnetic layer 4 in the first embodiment, whereas the magnetization vector of the first free magnetic layer 20 having a smaller thickness is aligned in the direction opposite to the magnetization vector $M_f$ of the free magnetic layer 4.

When an external magnetic field is applied from the magnetic recording medium in the Y direction, the magnetization vectors of the first and second free magnetic layers 20 and 22, respectively, rotate by the effect of the external magnetic field while maintaining the ferrimagnetic state. The variable magnetization of the first free magnetic layer 20 contributing to the ΔR/R value and the pinned magnetization of the second pinned magnetic layer 12 cause a change in electrical resistance of the element. As a result, the external magnetic field is detected as the change in the electrical resistance.

The longitudinal biasing magnetic field is applied to the first and second free magnetic layers 20 and 22, respectively, due to the magnetization of the longitudinal biasing layers 7 to achieve a smooth change in resistance without the generation of Barkhausen noise.

Other effects of the second embodiment are substantially the same as those of the first embodiment. Both the magnetization vector of the first free magnetic layer 20 and the magnetization vector of the second free magnetic layer 22 are orthogonal to the magnetization vector of the pinned magnetic layer 2 to reduce asymmetry when the detecting current magnetic field $H_j$ is applied.

Third Embodiment

Figure 11:
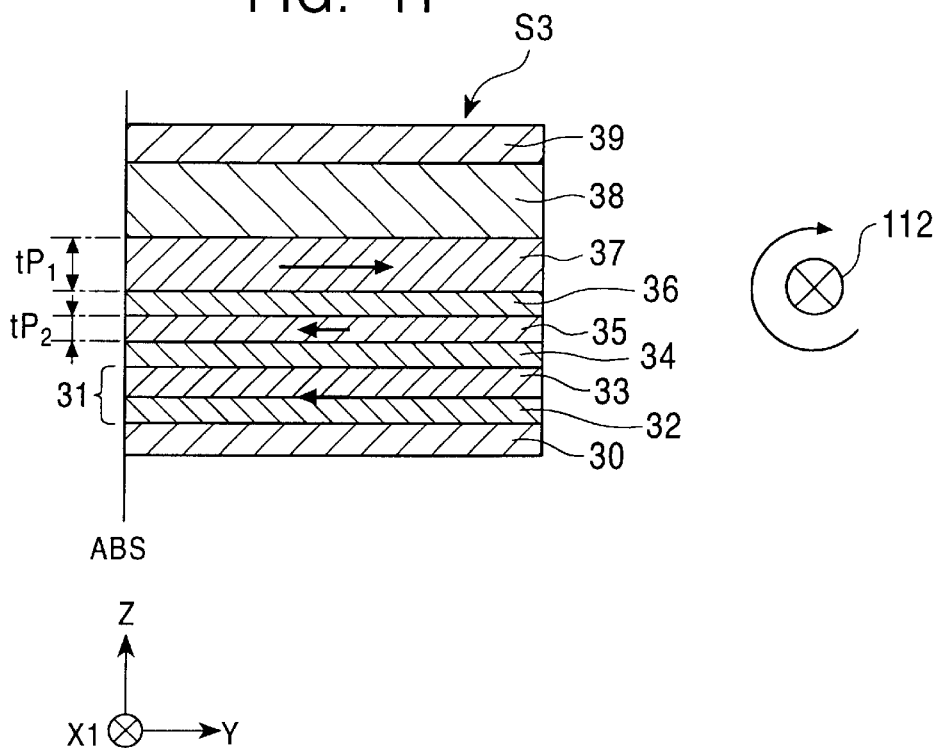
FIG. 11 is a cross-sectional view of a third embodiment of a spin-valve magnetoresistive element in accordance with the present invention.
Figure 12:
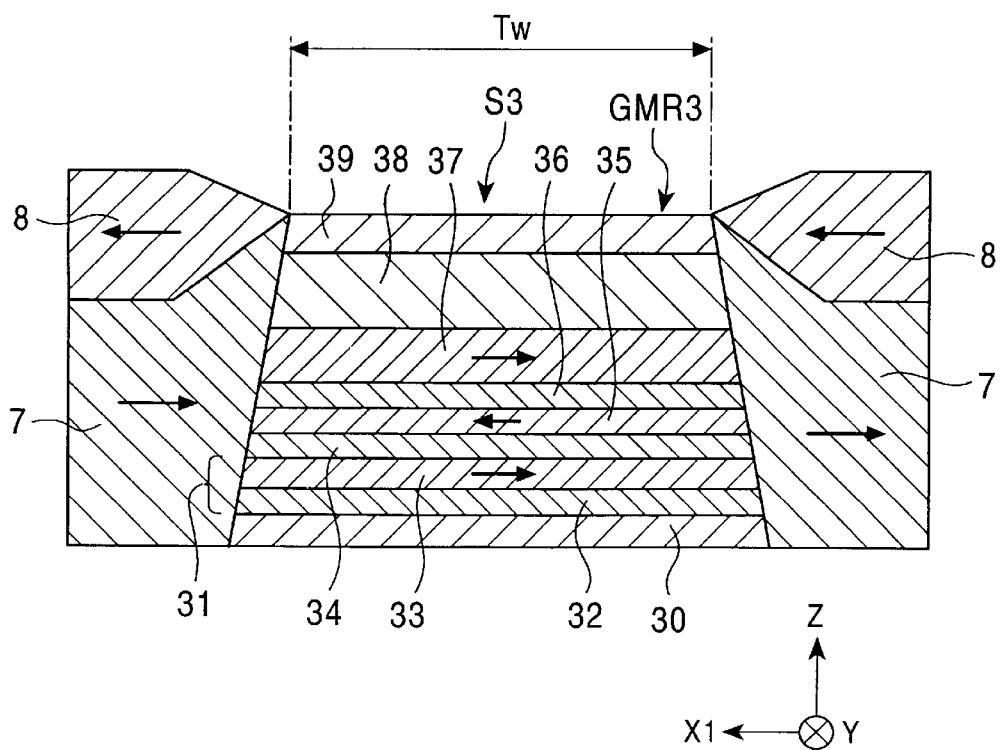
FIG. 12 is a cross-sectional view of the spin-valve magnetoresistive element shown in FIG. 11, when viewed from a face opposing a magnetic recording medium.

FIGS. 11 and 12 are schematic cross-sectional views of a third embodiment of a spin-valve magnetoresistive element of the present invention. This spin-valve magnetoresistive element GMR3 is of a top type in which the layer configuration is inverted, compared to the top-type spin-valve magnetoresistive element in the first embodiment.

That is, in the spin-valve magnetoresistive element GMR3 shown in FIGS. 11 and 12, an underlying film 30, a NiFe film 32, a Co film 33 (the NiFe film 32 and the Co film 33 constituting a free magnetic layer 31), a nonmagnetic conductive layer 34, a second pinned magnetic layer 35, a nonmagnetic interlayer 36, a first pinned magnetic layer 37, an antiferromagnetic layer 38, and a protective layer 39 are deposited in that order to form a composite S3.

The antiferromagnetic layer 38 is preferably composed of a PtMn alloy, an XMn alloy, or an XMnX' alloy as in the antiferromagnetic layer 1 in the first embodiment. The nonmagnetic interlayer 36 disposed between the first pinned magnetic layer 37 and the second pinned magnetic layer 35 is preferably composed of at least one element selected from the group consisting of Ru, Rh, Ir, Cr, Re, and Cu.

In the spin-valve magnetoresistive element GMR3, the thickness $tP_1$ of the first pinned magnetic layer 37 is different from the thickness $tP_2$ of the second pinned magnetic layer 35. For example, the thickness $tP_1$ of the first pinned magnetic layer 37 may be larger than the thickness $tP_2$ of the second pinned magnetic layer 35.

The magnetization vector of the first pinned magnetic layer 37 and the magnetization vector of the second pinned magnetic layer 35 are antiparallel to each other (ferrimagnetic state). For example, the magnetization vectors of the first and second pinned magnetic layer 37 and 35, respectively, have Y-axis components shown in FIG. 11 and X1-axis components shown in FIG. 12. Longitudinal biasing layers 7 and current leading layers 8 are formed on both side faces of the composite S3, as in the first embodiment. The longitudinal biasing layers 7 generate a longitudinal biasing magnetic field so that the magnetization vector of the free magnetic layer 31 is aligned in the direction opposite to the X1 direction.

Also, in the third embodiment, the angle between the magnetization vector of the free magnetic layer 31 and the magnetization vectors of the first and second pinned magnetic layer 37 and 35, respectively, is similar to that shown in FIG. 3.

The current leading layers 8 supply a detecting current to the free magnetic layer 31, the nonmagnetic conductive layer 34, and the first and second pinned magnetic layer 37 and 35, respectively. An external magnetic field from the magnetic recording medium in the Y direction in FIG. 12 rotates the magnetization vector of the free magnetic layer 31 from the direction opposite to the X1 direction to the Y direction. Thus, spin-dependent scattering of conduction electrons occurs at the interface between the nonmagnetic conductive layer 34 and the free magnetic layer 31 and between the nonmagnetic conductive layer 34 and the second pinned magnetic layer 35, resulting in a change in electrical resistance. Accordingly, the fringing magnetic field from the magnetic recording medium is detected as the change in electrical resistance.

By analogy to the magnetization vectors shown in FIG. 3, the magnetization vector of the free magnetic layer 31 is orthogonal to the magnetization vectors of the first and second pinned magnetic layer 37 and 35, respectively, by the effects of the longitudinal biasing magnetic field applied to the free magnetic layer 31 and the detecting current magnetic field $H_j$ due to the detecting current. The fringing magnetic field from the magnetic recording medium rotates the magnetization vector of the free magnetic layer 31. Thus, a large change in resistance is obtained in the spin-valve magnetoresistive element GMR3. Moreover, the longitudinal biasing magnetic field aligns the free magnetic layer 31 to a single-domain state. Thus, the change in resistance is smooth and does not cause Barkhausen noise.

Other effects of the third embodiment are substantially the same as the effects of the first embodiment. That is, the magnetization vector of the free magnetic layer 31 is orthogonal to the magnetization vector of the first pinned magnetic layer 37 or the magnetization vector of the second pinned magnetic layer 35, when the detecting current magnetic field $H_j$ is applied. Thus, the asymmetry can be reduced.

Fourth Embodiment

Figure 13:
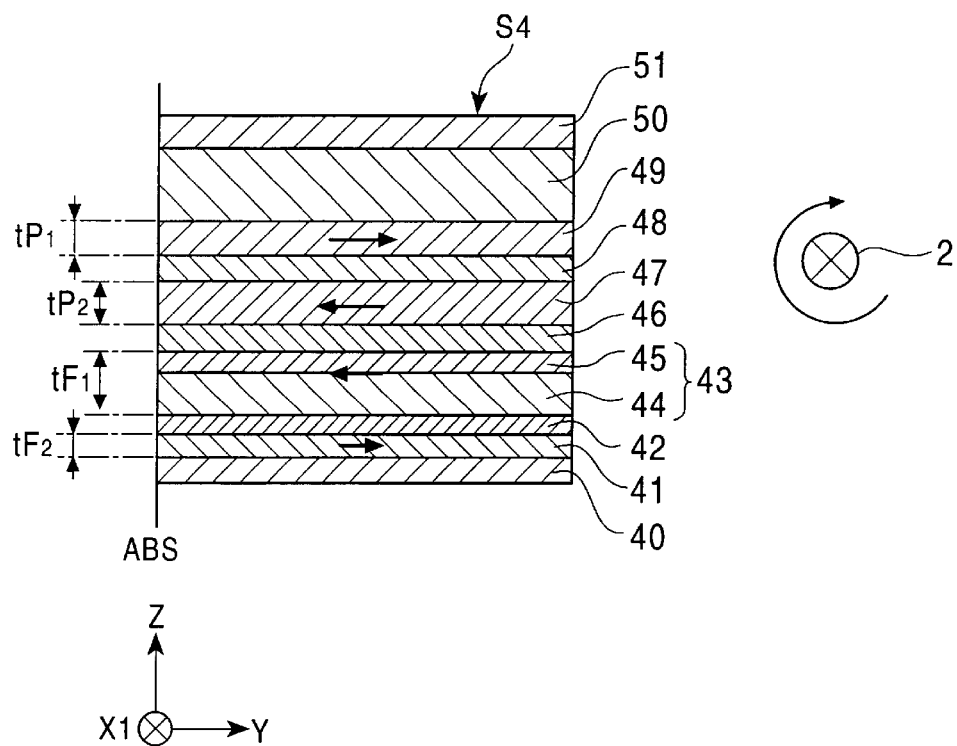
FIG. 13 is a cross-sectional view of a fourth embodiment of a spin-valve magnetoresistive element in accordance with the present invention.
Figure 14:
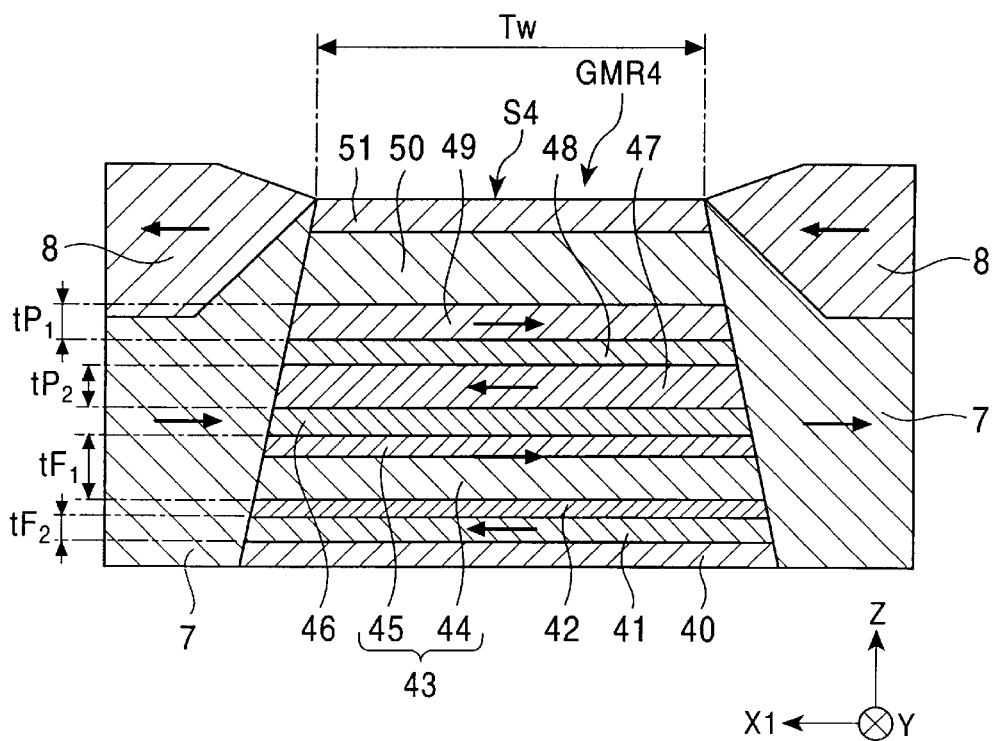
FIG. 14 is a cross-sectional view of the spin-valve magnetoresistive element shown in FIG. 13, when viewed from a face opposing a magnetic recording medium.

FIG. 13 is a schematic cross-sectional view of a fourth embodiment of a spin-valve magnetoresistive element of the present invention, and FIG. 14 is a cross-sectional view of the spin-valve magnetoresistive element shown in FIG. 13 when viewed from a face opposing a magnetic recording medium. This spin-valve magnetoresistive element GMR4 is of a top type in which the layer configuration is inverted, compared to the bottom-type spin-valve magnetoresistive element in the second embodiment. That is, an underlying film 40, a second free magnetic layer 41, a nonmagnetic interlayer 42, a first free magnetic layer 43, a nonmagnetic conductive layer 46, a second pinned magnetic layer 47, a nonmagnetic interlayer 48, a first pinned magnetic layer 49, an antiferromagnetic layer 50, and a protective layer 51 are formed in that order from the bottom to form a composite S4.

The first pinned magnetic layer 49 and the second pinned magnetic layer 47 are composed of Co metal, a NiFe alloy, a CoFe alloy, or a CoNiFe alloy. The nonmagnetic interlayer 48 is preferably composed of at least one metal selected from the group consisting of Ru, Rh, Ir, Cr, Re, and Cu. The nonmagnetic conductive layer 46 is formed of Cu or the like.

In the spin-valve magnetoresistive element GMR4, the free magnetic layer has a double-layer configuration including a first free magnetic layer 43 in contact with the nonmagnetic conductive layer 46 and a second free magnetic layer 41. Moreover, the first free magnetic layer 43 includes a first free layer 45 and a second free layer 44. The first free layer 45 is in contact with the nonmagnetic conductive layer 46 and is composed of a Co film. The second free layer 44 is in contact with the nonmagnetic interlayer 42. The second free layer 44 and the second free magnetic layer 41 are formed of a NiFe alloy, a CoFe alloy, a CoNiFe alloy, or the like.

Both sides of the composite S4 including the underlying film 40 to the protective layer 51 shown in FIG. 14 have slopes and the composite S4 has a trapezoidal cross-section. Longitudinal biasing layers 7 and current leading layers 8 are formed on the sloping sides of the composite S4. The longitudinal biasing layers 7 are magnetized in a direction opposite to the X1 direction in the drawing. A biasing magnetic field from the longitudinal biasing layers 7 aligns the magnetization vector of the first free magnetic layer 43 in the direction opposite to the X1 direction.

The first free magnetic layer 43 and the second free magnetic layer 41 are separated by the nonmagnetic interlayer 42 so that the magnetization vector of the first free magnetic layer 43 and the magnetization vector of the second free magnetic layer 41 are antiparallel to each other due to an exchange coupling magnetic field (RKKY interaction) generated between the first free magnetic layer 43 and the second free magnetic layer 41. In the spin-valve magnetoresistive element GMR4 shown in FIG. 13, the thickness $tF_1$ of the first free magnetic layer 43 is larger than the thickness $tF_2$ of the second free magnetic layer 41. Moreover, the magnetic thickness $Ms \cdot tF_1$ of the first free magnetic layer 43 is larger than the magnetic thickness $Ms \cdot tF_2$ of the second free magnetic layer 41. When a biasing magnetic field is applied in the direction opposite to the X1 direction from the longitudinal biasing layers 7, the magnetization of the first free magnetic layer 43 having a larger magnetic thickness $Ms \cdot tF_1$ is aligned in the direction opposite to the X1 direction due to the effect of the biasing magnetic field, whereas the magnetization of the second free magnetic layer 41 having a smaller magnetic thickness $Ms \cdot tF_2$ is aligned substantially in the X1 direction due to the exchange coupling magnetic field (RKKY interaction) with the first free magnetic layer 43.

It is preferable that the nonmagnetic interlayer 42 disposed between the first free magnetic layer 43 and the second free magnetic layer 41 be composed of at least one element selected from the group consisting of Ru, Rh, Ir, Cr, Re, and Cu.

In the present invention, the thickness $tF_1$ of the first free magnetic layer 43 may be smaller than the thickness $tF_2$ of the second free magnetic layer 41, and the magnetic thickness $Ms \cdot tF_1$ of the first free magnetic layer 43 may be smaller than the magnetic thickness $Ms \cdot tF_2$ of the second free magnetic layer 41. In this case, the magnetization vector of the second free magnetic layer 41 having a larger magnetic thickness is aligned in the direction opposite to the X1 direction, whereas the magnetization vector of the first free magnetic layer 43 having a smaller magnetic thickness is aligned substantially in the X1 direction.

The magnetization vectors of the second and first free magnetic layers 41 and 43, respectively, and the magnetization vectors of the first and second pinned magnetic layer 49 and 47, respectively, when a detecting current magnetic field $H_j$ is applied, are similar to those shown in FIGS. 3A and 3B. The composite S4, however, includes two free magnetic layers, that is, the first free magnetic layer 43 and the second free magnetic layer 41. Thus, the magnetization vector of the first free magnetic layer 43 having a larger magnetic thickness is aligned in the direction which corresponds to the magnetization vector $M_f$ of the free magnetic layer 4 in the third embodiment, and the magnetization vector of the second free magnetic layer 41 having a smaller magnetic thickness is aligned in the direction opposite to the magnetization vector $M_f$.

When an external magnetic field from a magnetoresistive film in the Y direction is applied to the spin-valve magnetoresistive element GMR4, the magnetization vectors of the first free magnetic layer 43 and the second free magnetic layer 41 rotate by the effect of the external magnetic field while maintaining the ferrimagnetism. Thus, the signal of the external magnetic field is detected by a change in electrical resistance which is generated by the relationship between the magnetization vector of the first free magnetic layer 43 contributing to the ΔR/R value and the pinned magnetization vector of the second pinned magnetic layer 47. Since the second free magnetic layer 41 and the first free magnetic layer 43 are aligned in single-domain states due to the biasing magnetic field from the longitudinal biasing layers 7, a smooth change in resistance is achieved without formation of Barkhausen noise.

Other effects of the fourth embodiment are the substantially the same as those of the first embodiment. Both the magnetization vector of the first free magnetic layer 43 and the magnetization vector of the second free magnetic layer 41 are orthogonal to the magnetization vector of the first pinned magnetic layer 49 or the magnetization vector of the second pinned magnetic layer 47 to reduce asymmetry when the detecting current magnetic field $H_j$ is applied.

EXAMPLES

Using a spin-valve magnetoresistive element having the following configuration, tests were performed. The spin-valve magnetoresistive element had a composite of ALTIC ($Al_2O_3$—TiC) substrate/alumina ($Al_2O_3$) underlying layer/lower shielding layer (amorphous Co—Nb—Zr alloy, thickness: $1 \times 10^{-6}$ m)/lower gap layer ($Al_2O_3$, thickness: 500 Å)/underlying layer (Ta, thickness: 30 Å)/antiferromagnetic layer (PtMn, thickness: 300 Å)/first pinned magnetic layer (Co, thickness: 15 Å)/nonmagnetic interlayer (Ru, thickness: 8 Å)/second pinned magnetic layer (Co, thickness: 20 Å)/nonmagnetic conductive layer (Cu, thickness: 27 Å)/free magnetic layer (Co, thickness: 10 Å+NiFe, thickness: 50 Å)/protective layer (Ta, thickness: 30 Å)/upper gap layer ($Al_2O_3$, thickness: 850 Å)/upper shielding layer (permalloy=Ni–Fe alloy, thickness: $3 \times 10^{-6}$ m). Longitudinal biasing layers (Co—Pt alloy, thickness: 300 Å) and current lead layers (Cr, thickness: 1,200 Å) were deposited on both side of the composite.

This spin-valve magnetoresistive element was formed by the method shown in FIGS. 7A to 7G. The lower shielding layer having a thickness of $1 \times 10^{-6}$ m was deposited on a wafer substrate of ALTIC ($Al_2O_3$—TiC)/$Al_2O_3$ using a sputtering system. The lower gap layer (alumina layer) having a thickness of 500 Å was formed on the wafer substrate using the sputtering system, and the Ta underlying layer and the antiferromagnetic layer were deposited thereon. The first pinned magnetic layer, the nonmagnetic interlayer, the second pinned magnetic layer, and the nonmagnetic conductive layer were deposited in that order. When the first pinned magnetic layer and the second pinned magnetic layer were formed, a magnetic field of 8 kA/m was applied in a direction orthogonal to the track width direction. Next, the nonmagnetic conductive layer was deposited. The free magnetic layer was deposited while a first magnetic field was applied in the first direction along the track width direction. The protective layer was deposited in the sputtering system.

As shown in FIG. 7B, the composite was subjected to the first annealing treatment at 250° C. (523 K) while the second magnetic field $H_2$ of 400 kA/m was applied in the second direction $D_2$ which was tilted by an angle θ of 10° from the direction $D_A$ which was orthogonal to the track width direction. The disordered PtMn alloy of the antiferromagnetic layer was ordered during the first annealing treatment to generate magnetic exchange coupling which magnetized the first pinned magnetic layer in the second direction $D_2$. When the second magnetic field $H_2$ was applied during the first annealing treatment, both the magnetization vector of the first pinned magnetic layer and the magnetization vector of the second pinned magnetic layer were aligned in the second direction $D_2$. After the second magnetic field $H_2$ was removed, the magnetization vector of the second pinned magnetic layer was shifted in the direction opposite to the magnetization vector of the first pinned magnetic layer due to the exchange coupling magnetic field (RKKY interaction)

between the first pinned magnetic layer and the second pinned magnetic layer (antiparallel arrangement).

The composite was subjected to another annealing treatment at 200° C. (473 K) while a first magnetic field $H_1$, which is smaller than the second magnetic field $H_2$, was applied in the first direction $D_1$ parallel to the track width direction to align the uniaxial anisotropic axes in the free magnetic layer in the track width direction.

After the longitudinal biasing layers and the electrode layers were formed by a lift-off process, the alumina upper gap layer having a thickness of 850 Å was deposited by a sputtering process. The permalloy (NiFe) upper shielding layer was formed by a plating process; a recording gap and a coil were formed thereon. The coil was covered with an insulating resin and the upper core layer was formed on the coil.

In order to cure the insulating resin, the composite was annealed at 200° C. (473 K) for 60 minutes. The temperature and the time correspond to those for curing the thermosetting resin for coil insulation which is used in production of the thin-film magnetic head having a magnetic inductive write head shown in FIGS. 4 to 6. Uniaxial anisotropy in the free magnetic layer, the lower shielding layer, and the upper shielding layer was disoriented during the annealing treatment.

The composite was subjected to the second annealing treatment at 200° C. (473 K) while the third magnetic field $H_3$, which was sufficiently smaller than the second magnetic field $H_2$, was applied in the direction $D_1$ parallel to the track width direction to align the uniaxial anisotropy of the free magnetic layer, the lower shielding layer, and the upper shielding layer in the $D_1$ parallel to the track width direction.

Next, the fourth magnetic field $H_4$ was applied to the fourth direction $D_4$ parallel to the track width direction to magnetize the hard biasing layers in the fourth direction $D_4$.

Figure 15:
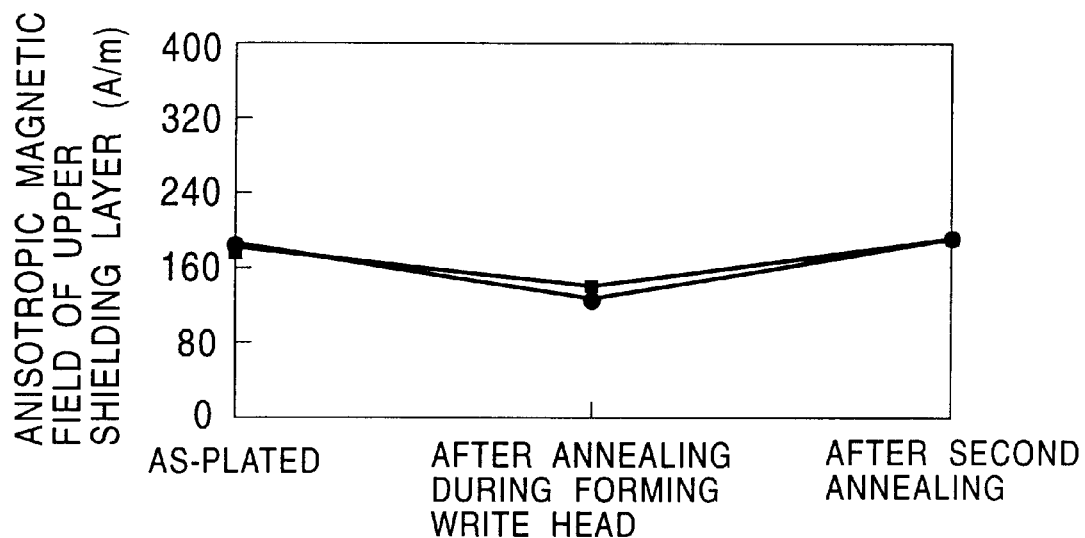
FIG. 15 is a graph of an anisotropic magnetic field of an upper shielding layer of a composite of the present invention at each production step.

FIG. 15 is a graph of the results of anisotropic magnetic fields of the upper shield layer formed on the wafer, after the upper shielding layer is formed on the wafer, after the upper shielding layer is subjected to a heat treatment which is supposed to be applied in the production of write heads, and after the upper shielding layer is subjected to the second annealing treatment. Two wafers were measured. FIG. 15 shows that the anisotropic magnetic field of the upper shielding layer is reduced after the annealing in the production of the write head and recovers to the original level after the second annealing treatment.

Figure 16:
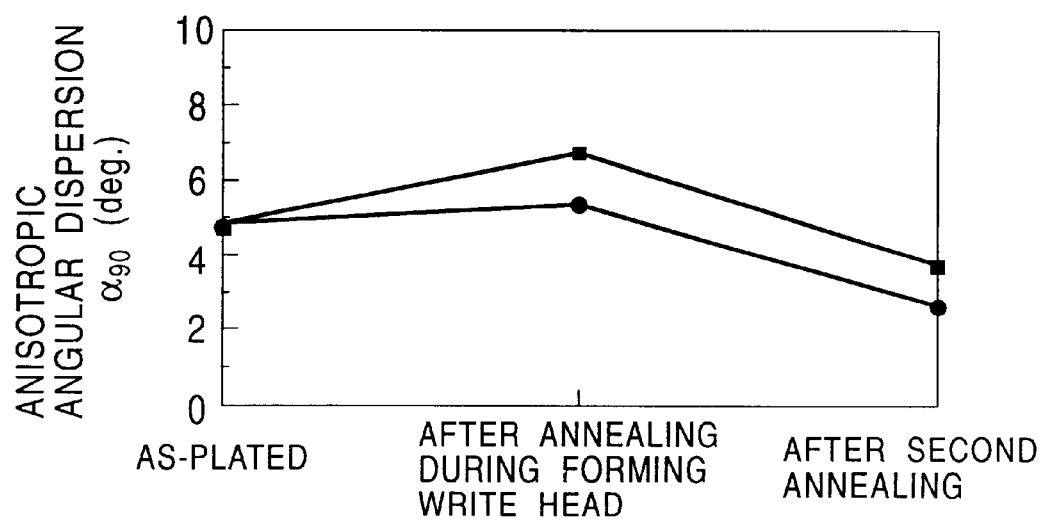
FIG. 16 is a graph of an anisotropic angular dispersion of an upper shielding layer of a composite of the present invention at each production step.

FIG. 16 is a graph of the results of the anisotropic angular dispersion $\alpha_{90}$ of the upper shield layer formed on the wafer, after the upper shielding layer is formed on the wafer, after the upper shielding layer is subjected to a heat treatment which is supposed to be applied in the production of write heads, and after the upper shielding layer is subjected to the second annealing treatment. Two wafers were measured. Here, the anisotropic angular dispersion $\alpha_{90}$ indicates the angle from the intended easy axis direction in which 90% by area ratio of the disordered easy axes are present within the angle on the entire wafer surface. For example, an anisotropic angular dispersion $\alpha_{90}$ of 5° means that 90% by area ratio of disordered easy axes are present in a range within 5° from the intended easy axis direction. In other words, in 10% of the localized regions in the overall wafer surface, easy axes deviate by 5° or more from the intended direction.

FIG. 16 shows that the anisotropic angular dispersion of the upper shielding layer is 5° after the formation by plating, is increased after the annealing in the production of the write head, and is reduced after the second annealing treatment.

Accordingly, the above method can suppress anisotropic dispersion in the easy axis direction.

Figure 17A:
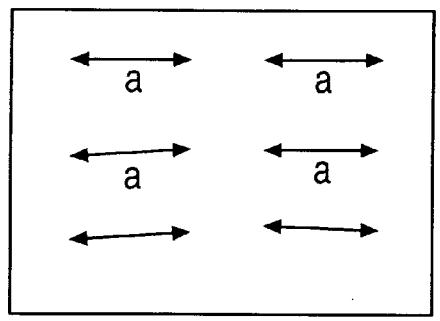
FIGS. 17A to 17C are schematic views of orientation of easy axes in an upper shielding layer at each production step.
Figure 17B:
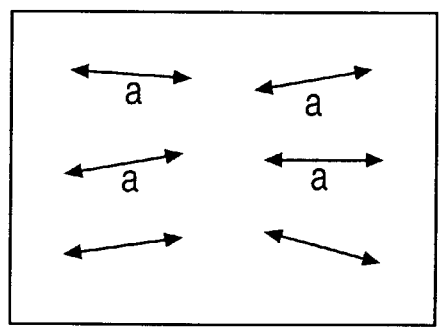
Figure 17C:
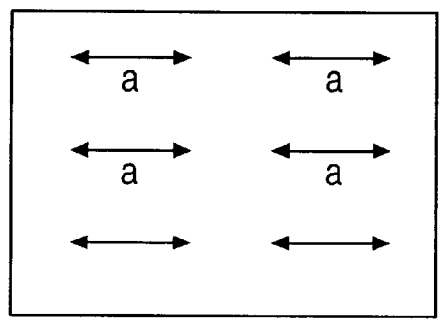

FIGS. 17A to 17C show localized fluctuation of the easy axes shown in FIG. 16. As shown in FIG. 17A, the easy axes are considerably ordered in the direction a after the plating of the upper shielding layer. As shown in FIG. 17B, the easy axes are disordered during the formation of the write head. As shown in FIG. 17C, such disorder is modified in the second annealing treatment and the easy axes are significantly aligned compared to the original state.

If a magnetic head including an upper shielding layer having a disordered state shown in FIG. 17B is produced, the magnetization of the upper shielding layer varies when a write head records magnetic information onto a magnetic recording medium. Thus, the magnetic peripheral environment varies when the read head reads the magnetic information from the magnetic recording medium, resulting in changes in read output and reading accuracy of the magnetic information. When the easy axes of the upper shielding layer are aligned, as shown in FIG. 17C, the magnetization vector of the upper shielding layer does not change during repeated writing operations of the write head. As a result, the upper shielding layer does not affect the reading accuracy of the spin-valve magnetoresistive element. A small anisotropic angular dispersion over the entire wafer surface means that the anisotropic angular dispersion in the upper shielding layer is barely affected by the positions in the wafer when many spin-valve magnetoresistive elements are formed on one wafer. In other words, many spin-valve magnetoresistive elements can be produced from one wafer with an improved yield.

Figure 18:
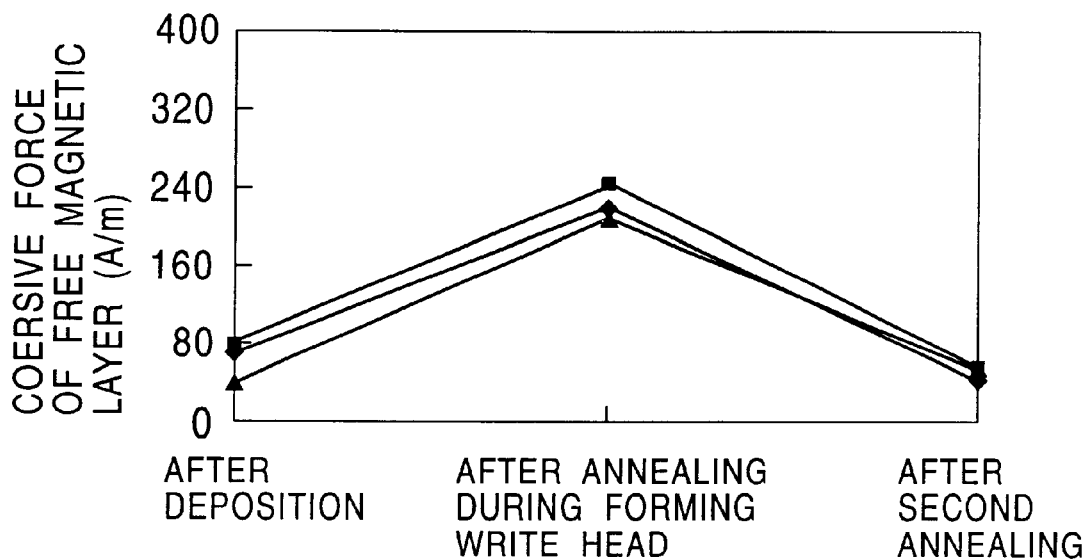
FIG. 18 is a graph of a coercive force of a free magnetic layer of a composite of the present invention at each production step.

FIG. 18 is a graph of the coercive force of the free magnetic layer after each process using three wafers. The coercive force was measured after a free magnetic layer was formed on each wafer. All the three samples showed a coercive force of 80 A/m or less. The coercive force of the free magnetic layer after the annealing treatment for the formation of the write head was increased to 160 to 240 A/m. Moreover, after the second annealing treatment, the coercive force of the free magnetic layer was decreased to a level, which was lower than that after the formation thereof.

Figure 19:
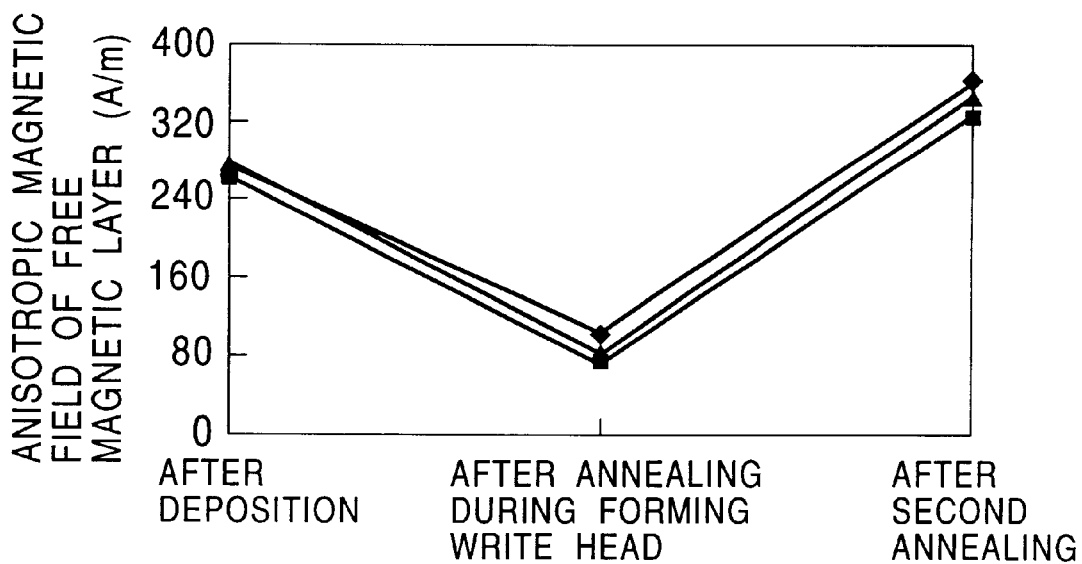
FIG. 19 is a graph of an anisotropic magnetic field of a free magnetic layer of a composite of the present invention at each production step.

FIG. 19 is a graph of the anisotropic magnetic field of the free magnetic layer after each process using three wafers. The anisotropic magnetic field of the free magnetic layer was approximately 280 A/m after the deposition thereof, and was decreased after the annealing treatment for the formation of the write head. The anisotropic magnetic field of the free magnetic layer was increased to approximately 320 A/m after the second annealing treatment.

Figure 20A:
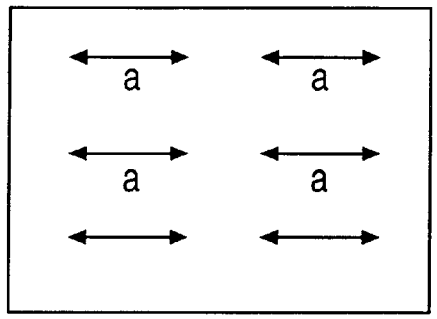
FIGS. 20A to 20C are schematic views of orientation of easy axes in a free magnetic layer at each production step.
Figure 20B:
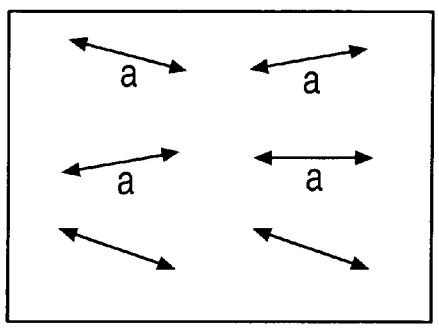
Figure 20C:
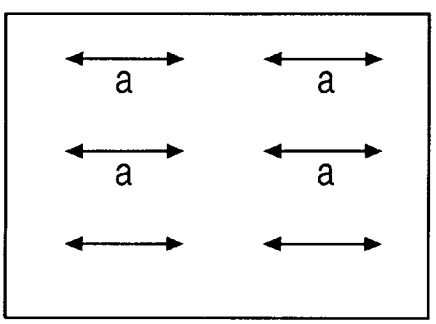

FIGS. 20A to 20C show fluctuation of the easy axes in the free magnetic layer. As shown in FIG. 20A, the anisotropic magnetic field is considerably ordered in the direction a after the formation of the free magnetic layer. As shown in FIG. 20B, the anisotropic magnetic field is disordered during the formation of the write head. As shown in FIG. 20C, such disorder is modified in the second annealing treatment and the anisotropic magnetic field is significantly aligned.

Figure 21:
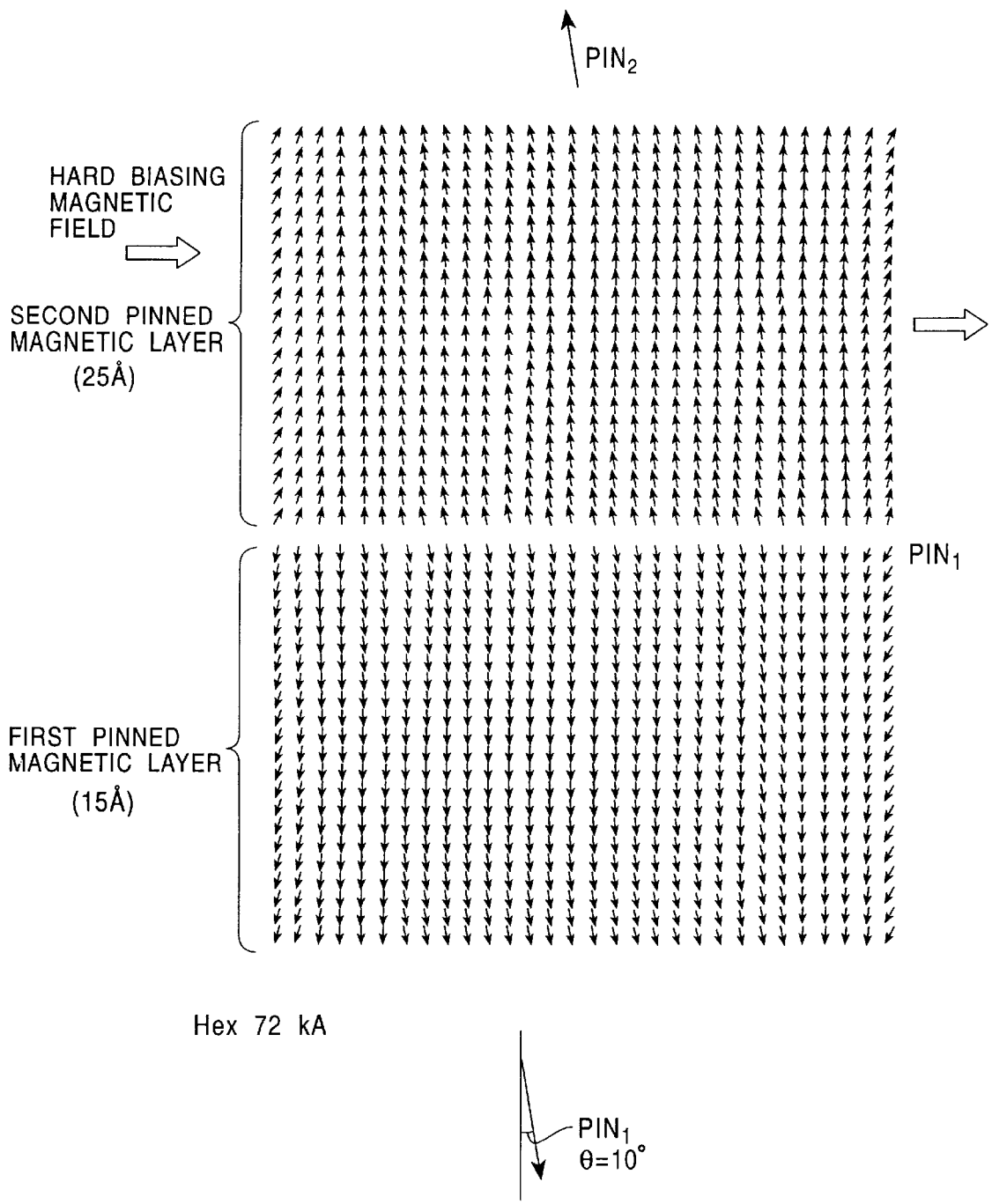
FIG. 21 is a schematic view of magnetization vectors at various positions of a first pinned magnetic layer and a second pinned magnetic layer in a composite of the present invention.
Figure 22:
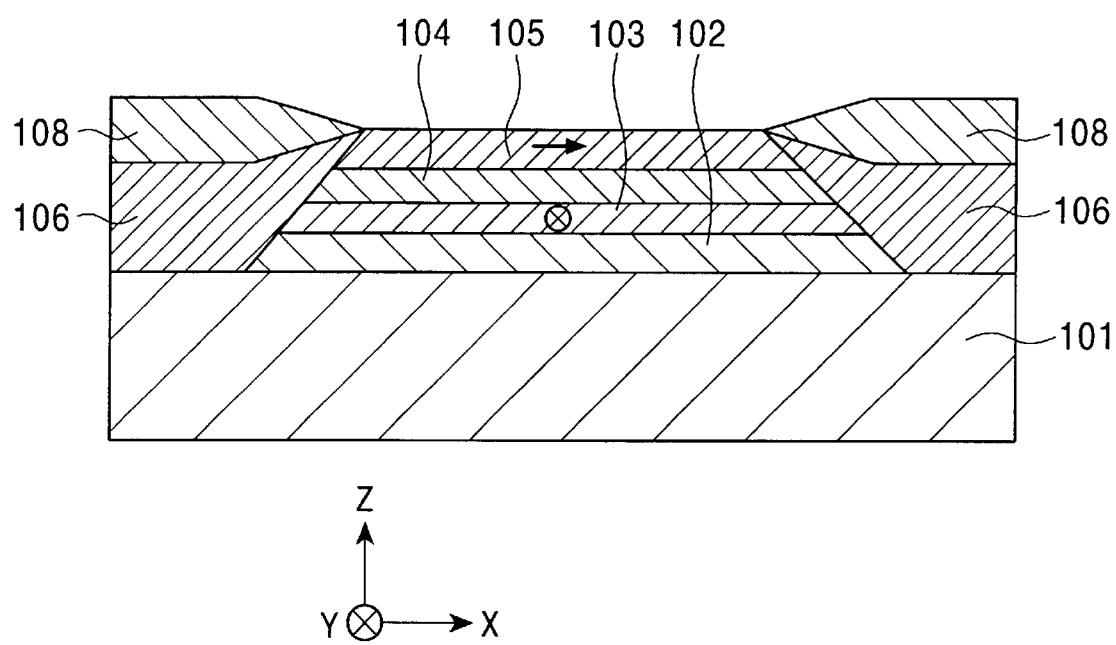
FIG. 22 is a cross-sectional view of a conventional spin-valve magnetoresistive element when viewed from a face opposing a recording medium.
Figure 23:
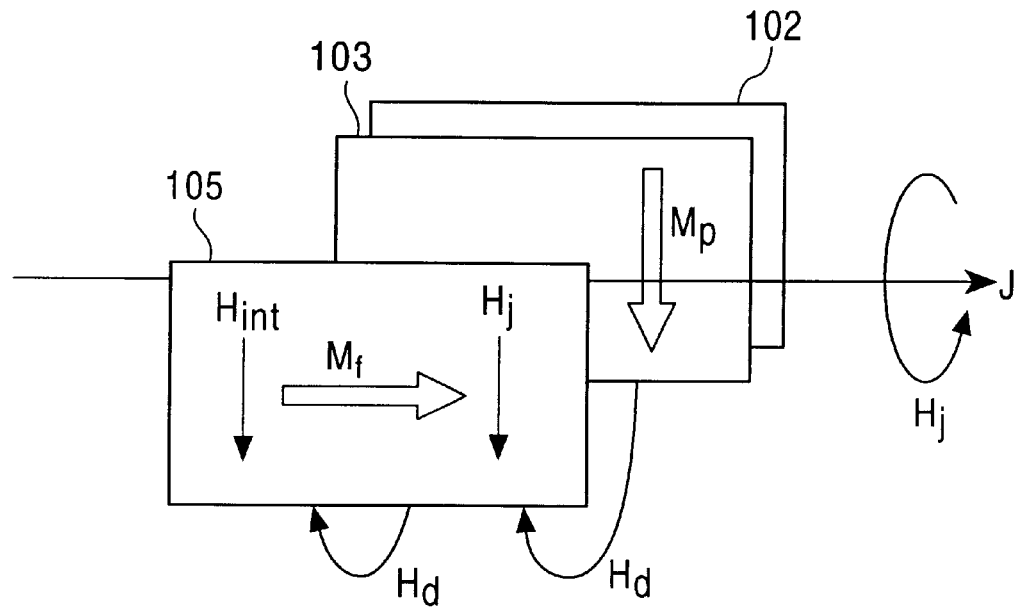
FIG. 23 is a schematic view of magnetization vectors of a pinned magnetic layer having a single layer configuration and a free magnetic layer in a conventional spin-valve magnetoresistive element.
Figure 24:
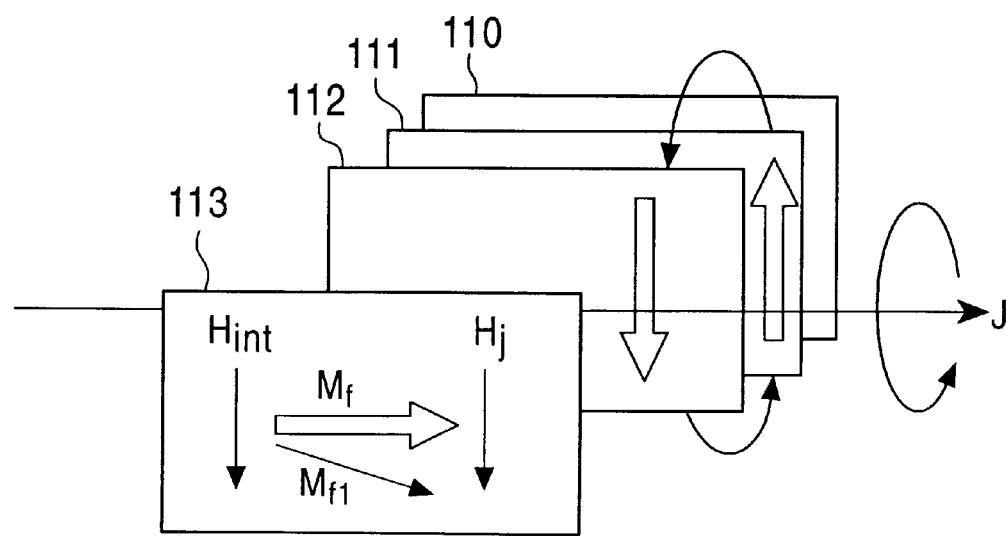
FIG. 24 is a schematic view of magnetization vectors of a pinned magnetic layer having a double layer configuration and a free magnetic layer in a conventional spin-valve magnetoresistive element.

FIG. 21 shows the results of micromagnetic simulation of planar magnetization vectors of various positions of the first pinned magnetic layer and the second pinned magnetic layer when a longitudinal biasing magnetic field is applied to the first pinned magnetic layer and the second pinned magnetic layer from a hard biasing layer to the right direction. In FIG. 21, the second pinned magnetic layer is affected by the longitudinal biasing magnetic field from the hard biasing layer, and the overall exchange coupling magnetic field Hex in the composite is 72 kA/m.

In this configuration, the second pinned magnetic layer having a larger magnetic thickness is primarily affected by the hard biasing magnetic field, whereas the first pinned magnetic layer is aligned in the direction opposite to the magnetization vector of the second pinned magnetic layer. In the second pinned magnetic layer, magnetization vectors at the peripheral portions significantly deviate from 10° due to the effect of the magnetization of the hard biasing layer. The magnetization vectors of the peripheral portions of the first pinned magnetic layer also deviate from 10° in response to the corresponding magnetization vectors of the second pinned magnetic layer.

Although the spin-valve magnetoresistive element functions in the state shown in FIG. 21, the overall exchange coupling magnetic field (Hex) is preferably larger than 72 kA/m to more completely align the magnetization vectors of the second pinned magnetic layer and the first pinned magnetic layer at the peripheral portions, in order to enhance stability of the spin-valve magnetoresistive element.

In consideration of the slope of the magnetization vectors of the pinned magnetic layer shown in FIG. 21, the overall exchange coupling magnetic field (Hex) is preferably 96 kA/m or more to reduce as much as possible the fluctuation of magnetization vectors at the peripheral portions of the second pinned magnetic layer.

In the peripheral portions, the hard biasing magnetic field aligns the magnetization vectors of the second pinned magnetic layer in the magnetization vector of the hard biasing magnetic field, while the exchange anisotropy tilts the magnetization vectors of the second pinned magnetic layer in the opposite direction. Such magnetic frustration emphasizes disorder of the magnetization vectors in the peripheral portions (spin flop). As a result, the pinned magnetic layer has different magnetization vectors, that is, has a plurality of magnetic domains. In such a state, a change in resistance when the magnetization vector of the free magnetic layer rotates is insufficient, resulting in a decreased detecting accuracy of a fringing magnetic field from a magnetic recording medium. Moreover, the disordered regions may cause deterioration of stability of the spin-valve magnetoresistive element.

The peripheral regions of the pinned magnetic layer include a position nearest the magnetic recording medium in the vicinity of the ABS of the thin-film magnetic head. Since disorder of the magnetization in the pinned magnetic layer is emphasized by the effects of the demagnetizing field nearest the magnetic recording medium, the stability of the spin-valve magnetoresistive element is significantly affected. Thus, the tilt angle θ of the pinned magnetic layer is controlled to be preferably 30° or less, more preferably 15° or less, and most preferably 10° or more to suppress decreased stability and decreased output.

What is claimed is:

1. A spin-valve magnetoresistive element comprising:
an antiferromagnetic layer;
a first pinned magnetic layer in contact with the antiferromagnetic layer;
a nonmagnetic interlayer;
a second pinned magnetic layer, the nonmagnetic interlayer being disposed between the first pinned magnetic layer and the second pinned magnetic layer, the magnetization vector of the second pinned magnetic layer being aligned in a direction antiparallel to the magnetization vector of the first pinned magnetic layer;
a nonmagnetic conductive layer in contact with the second pinned magnetic layer;
a free magnetic layer in contact with the nonmagnetic conductive layer;
longitudinal biasing layers; and
a pair of lead layers;
wherein, when the detecting current is supplied from the lead layers, the magnetization vector of the free magnetic layer is aligned in a direction intersecting the magnetization vector of the second pinned magnetic layer, and the magnetization vector of the second pinned magnetic layer is tilted from the direction perpendicular to the track width direction toward a direction opposite to the longitudinal biasing magnetic field.

2. A spin-valve magnetoresistive element comprising:
an antiferromagnetic layer;
a first pinned magnetic layer in contact with the antiferromagnetic layer;
a nonmagnetic interlayer;
a second pinned magnetic layer, the nonmagnetic interlayer being disposed between the first pinned magnetic layer and the second pinned magnetic layer, the magnetization vector of the second pinned magnetic layer being aligned in a direction antiparallel to the magnetization vector of the first pinned magnetic layer;
a nonmagnetic conductive layer in contact with the second pinned magnetic layer;
a free magnetic layer in contact with the nonmagnetic conductive layer;
longitudinal biasing layers; and
a pair of lead layers;
wherein, when the detecting current is supplied from the lead layers, the magnetization vector of the free magnetic layer is aligned in a direction intersecting the magnetization vector of the second pinned magnetic layer, and the magnetization vector of the free magnetic layer is tilted from the track width direction toward the magnetization vector of the second pinned magnetic layer.

3. A spin-valve magnetoresistive element according to claim 1, wherein the free magnetic layer is tilted by an angle θ in a range of 2° to 30°.

4. A spin-valve magnetoresistive element according to claim 1, wherein the free magnetic layer is tilted by an angle θ in a range of 3° to 15°.

5. A spin-valve magnetoresistive element according to claim 1, wherein the free magnetic layer is tilted by an angle θ in a range of 3° to 10°.

6. A spin-valve magnetoresistive element according to claim 1, wherein, when the detecting current is supplied and when no external magnetic field is applied, the angle defined by the magnetization vector of the free magnetic layer and the magnetization vector of the second pinned magnetic layer is 90°.

7. A spin-valve magnetoresistive element according to claim 1, wherein the magnetic thickness of the first pinned magnetic layer is smaller than the magnetic thickness of the second pinned magnetic layer, the direction of the detecting current magnetic field applied to the free magnetic layer is opposite to the magnetization vector of the second pinned magnetic layer, and the direction of the detecting current magnetic field applied to the second pinned magnetic layer is opposite to the magnetization vector of the second pinned magnetic layer, wherein the magnetic thickness is defined by being the product of the saturation magnetization and the thickness.

8. A spin-valve magnetoresistive element according to claim 1, wherein the antiferromagnetic layer comprises one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

9. A spin-valve magnetoresistive element according to claim 1, wherein the overall exchange anisotropic magnetic field of the antiferromagnetic layer affecting a composite pinned magnetic layer including the first pinned magnetic layer and the second pinned magnetic layer is 96 kA/m or more.

10. A spin-valve magnetoresistive element according to claim 1, wherein the antiferromagnetic layer, the first pinned magnetic layer, the nonmagnetic interlayer, the second pinned magnetic layer, and the free magnetic layer are prepared by depositing each layer in that order on a substrate.

11. A spin-valve magnetoresistive element according to claim 1, wherein the free magnetic layer comprises a first free magnetic layer and a second free magnetic layer separated by a conductive interlayer provided therebetween.

12. A spin-valve magnetoresistive element according to claim 1, wherein the free magnetic layer, the nonmagnetic conductive layer, the second pinned magnetic layer, the conductive interlayer, the firs t pinned magnetic layer, and the antiferromagnetic layer are prepared by depositing each layer in that order on a substrate.

13. A spin-valve magnetoresistive element according to claim 2, wherein the angle θ is in a range of 2° to 30°.

14. A spin-valve magnetoresistive element according to claim 2, wherein the angle θ is in a range of 3° to 15°.

15. A spin-valve magnetoresistive element according to claim 2, wherein the angle θ is in a range of 3° to 10°.

16. A spin-valve magnetoresistive element according to claim 2, wherein the angle defined by the magnetization vector of the free magnetic layer and the magnetization vector of the second pinned magnetic layer is 90° when the detecting current is supplied and when no external magnetic field is applied.

17. A spin-valve magnetoresistive element according to claim 2, wherein, when the product of the saturation magnetization and the thickness is defined as a magnetic thickness, the magnetic thickness of the first pinned magnetic layer is smaller than the magnetic thickness of the second pinned magnetic layer, and the magnetization vector of the detecting current magnetic field, which is applied to the free magnetic layer and the second pinned magnetic layer, is opposite to the magnetization vector of the second pinned magnetic layer.

18. A spin-valve magnetoresistive element according to claim 2, wherein the antiferromagnetic layer comprises one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

19. A spin-valve magnetoresistive element according to claim 2, wherein the overall exchange anisotropic magnetic field of the antiferromagnetic layer affecting a composite pinned magnetic layer including the first pinned magnetic layer, the nonmagnetic interlayer, and the second pinned magnetic layer is 96 kA/m or more.

20. A spin-valve magnetoresistive element according to claim 2, wherein the antiferromagnetic layer, the first pinned magnetic layer, the nonmagnetic interlayer, the second pinned magnetic layer, the nonmagnetic conductive layer, and the free magnetic layer are prepared by depositing each layer in that order on a substrate.

21. A spin-valve magnetoresistive element according to claim 2, wherein the free magnetic layer comprises a first free magnetic layer and a second free magnetic layer separated by a conductive interlayer provided therebetween.

22. A spin-valve magnetoresistive element according to claim 2, wherein the free magnetic layer, the nonmagnetic conductive layer, the second pinned magnetic layer, the conductive interlayer, the first pinned magnetic layer, and the antiferromagnetic layer are prepared by depositing each layer in that order on a substrate.

23. A method for making a spin-valve magnetoresistive element comprising:

forming a composite comprising an antiferromagnetic layer, a first pinned magnetic layer, a nonmagnetic interlayer, a second pinned magnetic layer, a nonmagnetic conductive layer, and a free magnetic layer on a substrate, the free magnetic layer being formed while applying a first magnetic field in one of a first direction along a track width direction and a direction opposite to the first direction to impart uniaxial anisotropy in the track width direction to the free magnetic layer;

first annealing of the composite at a first annealing temperature while applying a second magnetic field in one of a second direction tilted by an angle θ from the normal of the track width direction and a third direction opposite to the second direction to generate an exchange anisotropic magnetic field at the interface between the antiferromagnetic layer and the first pinned magnetic layer so as to pin the magnetization of the first pinned magnetic layer and the magnetization of the second pinned magnetic layer in directions which are tilted by the angle θ from the normal of the track width direction and which are antiparallel to each other;

forming longitudinal biasing layers, for applying a biasing magnetic field to the free magnetic layer, on both sides of the laminate;

second annealing of the laminate at a second annealing temperature while applying a third magnetic field to the free magnetic layer in one of the first direction and a direction opposite to the first direction to impart uniaxial anisotropy to the free magnetic layer; and applying a fourth magnetic field in a fourth direction opposite to the component in the track width direction of the magnetization vector of the second pinned magnetic layer to magnetize the longitudinal biasing layers.

24. A method for making a spin-valve magnetoresistive element according to claim 23, wherein, when the magnetic thickness of the first pinned magnetic layer is smaller than the magnetic thickness of the second pinned magnetic layer, the intensity of the second magnetic field is 400 kA/m or more so as to align the magnetization vector of the first pinned magnetic layer in the second direction and the magnetization vector of the second pinned magnetic layer in the third direction, or the intensity of the second magnetic field is 8 to 80 kA/m so as to align the magnetization vector of the first pinned magnetic layer in the third direction and the magnetization vector of the second pinned magnetic layer in the second direction.

25. A method for making a spin-valve magnetoresistive element according to claim 23, wherein, when the magnetic thickness of the first pinned magnetic layer is larger than the magnetic thickness of the second pinned magnetic layer, the intensity of the second magnetic field is 400 kA/m or more so as to align the magnetization vector of the first pinned magnetic layer in the second direction and the magnetization vector of the second pinned magnetic layer in the third direction, or the intensity of the second magnetic field is 8 to 80 kA/m so as to align the magnetization vector of the first pinned magnetic layer in the second direction and the magnetization vector of the second pinned magnetic layer in the second direction.

26. A method for making a spin-valve magnetoresistive element according to claim 23, further comprising forming an inductive recording magnetic head onto the composite, provided between the first annealing and the second annealing.

27. A method for making a spin-valve magnetoresistive element according to claim 26, further comprising, prior to the forming of an inductive recording magnetic head, additional annealing of the composite while applying a magnetic field to the free magnetic layer in one of the first direction and the direction opposite to the first direction to impart uniaxial anisotropy in the track width direction to the free magnetic layer.

28. A method for making a spin-valve magnetoresistive element according to 23, wherein the third magnetic field applied in the second annealing is smaller than the second magnetic field applied in the first annealing.

29. A method for making a spin-valve magnetoresistive element according to claim 23, wherein the intensity of the third magnetic field applied in the second annealing is 8 kA/m to 40 kA/m.

30. A method for making a spin-valve magnetoresistive element according to claim 23, wherein the first annealing temperature is in a range of 230° C. to 280° C. and the second annealing temperature is in a range of 160° C. to 240° C.

31. A method for making a spin-valve magnetoresistive element according to claim 23, wherein the antiferromagnetic layer comprises one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

32. A method for making a spin-valve magnetoresistive element according to claim 23, wherein the antiferromagnetic layer is disposed between the substrate and the free magnetic layer.

33. A method for making a spin-valve magnetoresistive element comprising:
  forming a composite comprising an antiferromagnetic layer, a first pinned magnetic layer, a nonmagnetic interlayer, a second pinned magnetic layer, a nonmagnetic conductive layer, and a free magnetic layer on a substrate, the free magnetic layer being formed while applying a first magnetic field in one of a first direction along a track width direction and a direction opposite to the first direction to impart uniaxial anisotropy in the track width direction to the free magnetic layer;
  first annealing of the composite at a first annealing temperature while applying a second magnetic field in a second direction orthogonal to the track width direction to generate an exchange anisotropic magnetic field at the interface between the antiferromagnetic layer and the first pinned magnetic layer so as to pin the magnetization of the first pinned magnetic layer and the magnetization of the second pinned magnetic layer in a direction orthogonal to the track width direction;
  forming longitudinal biasing layers, for applying a biasing magnetic field to the free magnetic layer, on both sides of the laminate;
  second annealing of the laminate at a second annealing temperature while applying a third magnetic field to the free magnetic layer in one of the first direction and a direction opposite to the first direction to impart uniaxial anisotropy to the free magnetic layer and to tilt by an angle θ from the normal of the track width direction the magnetization vector of the first pinned magnetic layer and the magnetization vector of the second pinned magnetic layer; and
  applying a fourth magnetic field in a fourth direction opposite to the component in the track width direction of the magnetization vector of the second pinned magnetic layer to magnetize the longitudinal biasing layers.

34. A method for making a spin-valve magnetoresistive element according to claim 33, wherein the magnetic thickness of the first pinned magnetic layer is larger than the magnetic thickness of the second pinned magnetic layer, the magnetization vector of the first pinned magnetic layer is aligned in the second direction, and the magnetization vector of the second pinned magnetic layer is aligned in a direction opposite to the second direction.

35. A method for making a spin-valve magnetoresistive element according to claim 33, wherein, when the magnetic thickness of the first pinned magnetic layer is larger than the magnetic thickness of the second pinned magnetic layer, the intensity of the second magnetic field is 400 kA/m or more so as to align the magnetization vector of the first pinned magnetic layer in the second direction and the magnetization vector of the second pinned magnetic layer in a third direction opposite to the second direction, or the intensity of the second magnetic field is 8 to 80 kA/m so as to align the magnetization vector of the first pinned magnetic layer in the second direction and the magnetization vector of the second pinned magnetic layer in the third direction.

36. A method for making a spin-valve magnetoresistive element according to claim 33, wherein, when the magnetic thickness of the first pinned magnetic layer is smaller than the magnetic thickness of the second pinned magnetic layer, the intensity of the second magnetic field is 400 kA/m or more so as to align the magnetization vector of the first pinned magnetic layer in the second direction and the magnetization vector of the second pinned magnetic layer in a third direction opposite to the second direction, or the intensity of the second magnetic field is 8 to 80 kA/m so as to align the magnetization vector of the first pinned magnetic layer in the third direction and the magnetization vector of the second pinned magnetic layer in the second direction.

37. A method for making a spin-valve magnetoresistive element according to claim 33, further comprising forming an inductive recording magnetic head onto the composite, provided between the first annealing and the second annealing.

38. A method for making a spin-valve magnetoresistive element according to claim 33, wherein the third magnetic field applied in the second annealing is smaller than the second magnetic field applied in the first annealing.

39. A method for making a spin-valve magnetoresistive element according to claim 33, where in the first annealing temperature is in a range of 230° C. to 280° C. and the second annealing temperature is in a range of 160° C. to 240° C.

40. A method for making a spin-valve magnetoresistive element according to claim 33, wherein the antiferromagnetic layer comprises one of an XMn alloy and an XMnX' alloy wherein X is at least one element selected from the group consisting of Pt, Pd, Rh, Ir, Ru, and Os, and X' is at least one element selected from the group consisting of Au, Ag, Cr, Ni, Ne, Ar, Xe, and Kr.

41. A method for making a spin-valve magnetoresistive element according to claim 33, wherein the antiferromagnetic layer is disposed between the substrate and the free magnetic layer.

42. A method for making a spin-valve magnetoresistive element comprising:

a composite forming step for forming a composite comprising an antiferromagnetic layer, a first pinned magnetic layer, a nonmagnetic interlayer, a second pinned magnetic layer, a nonmagnetic conductive layer, and a free magnetic layer on a substrate, and for imparting uniaxial anisotropy in the track width direction to the free magnetic layer a first annealing step for pinning the magnetization of the first pinned magnetic layer and the magnetization of the second pinned magnetic layer in directions which are tilted from the normal of the track width direction and which are antiparallel to each other;

a biasing layer forming step for forming longitudinal biasing layers;

a second annealing step for imparting uniaxial anisotropy to the free magnetic layer; and a biasing layer magnetizing step for magnetizing the longitudinal biasing layers.

43. A method for making a spin-valve magnetoresistive element comprising:

a composite forming step for imparting uniaxial anisotropy in the track width direction to the free magnetic layer;

a first annealing step for pinning the magnetization of the first pinned magnetic layer and the magnetization of the second pinned magnetic layer in a direction orthogonal to the track width direction;

a biasing layer forming step for forming longitudinal biasing layers;

a second annealing step for imparting uniaxial anisotropy to the free magnetic layer and for tilting from the normal of the track width direction the magnetization vector of the first pinned magnetic layer and the magnetization vector of the second pinned magnetic layer; and a biasing layer magnetizing step for magnetizing the longitudinal biasing layers.

* * * * *

UNITED STATES PATENT AND TRADEMARK OFFICE
CERTIFICATE OF CORRECTION

PATENT NO. : 6,500,570 B2
DATED : December 31, 2002
INVENTOR(S) : Naoya Hasegawa et al.

It is certified that error appears in the above-identified patent and that said Letters Patent is hereby corrected as shown below:

Column 39,
Line 27, delete "firs t" and substitute -- first -- in its place.

Column 41,
Line 23, insert -- claim -- before "23".

Column 43,
Line 9, immediately after "layer" insert -- ; -- (semicolon).

Signed and Sealed this

Eighth Day of April, 2003

JAMES E. ROGAN
*Director of the United States Patent and Trademark Office*